United States Patent
Myung et al.

(10) Patent No.: US 8,166,367 B2
(45) Date of Patent: Apr. 24, 2012

(54) METHOD AND APPARATUS FOR ENCODING AND DECODING CHANNEL IN A COMMUNICATION SYSTEM USING LOW-DENSITY PARITY-CHECK CODES

(75) Inventors: Seho Myung, Suwon-si (KR);
Hwan-Joon Kwon, Suwon-si (JP);
Jae-Yoel Kim, Suwon-si (KR); Yeon-Ju Lim, Seoul (KR); Sung-Ryul Yun, Suwon-si (KR); Hak-Ju Lee, Incheon (KR); Hong-Sil Jeong, Seoul (KR); Kyeong-Cheol Yang, Seoul (KR); Peter Jung, Nordrhein-Westfalen (DE);
Kyung-Joong Kim, Pohang-si (KR)

(73) Assignees: Samsung Electronics Co., Ltd., Maetan-Dong, Yeongtong-Gu, Suwon-Si, Gyeonggi-Do (KR); Postech Academy Industry Foundation, Nam-Gu, Pohang-Si, Gyeongsanbuk-Do (KR)

( * ) Notice: Subject to any disclaimer, the term of this patent is extended or adjusted under 35 U.S.C. 154(b) by 801 days.

(21) Appl. No.: 12/329,728

(22) Filed: Dec. 8, 2008

(65) Prior Publication Data
US 2009/0158129 A1    Jun. 18, 2009

(30) Foreign Application Priority Data

Dec. 6, 2007    (KR) .................. 10-2007-0126083
Dec. 10, 2007    (KR) .................. 10-2007-0127365
Feb. 11, 2008    (KR) .................. 10-2008-0012082
Mar. 14, 2008    (KR) .................. 10-2008-0023848

(51) Int. Cl.
*G06F 11/00*    (2006.01)

(52) U.S. Cl. ...................................................... 714/758
(58) Field of Classification Search .................. 714/752, 714/758
See application file for complete search history.

(56) References Cited

U.S. PATENT DOCUMENTS 7,133,853 B2    11/2006  Richardson et al. ............. 706/15
7,334,181 B2 *   2/2008  Eroz et al. ..................... 714/801
(Continued)

FOREIGN PATENT DOCUMENTS

KR    2005-118056    12/2005
(Continued)

OTHER PUBLICATIONS

Shen, Ba-Zhong, et al.; Patent Application Publication No. US 2007/0162814 A1; Publication Date: Jul. 12, 2007; "LDPC (Low Density Parity Check) Code Size Adjustment by Shortening . . . ;". . . .

(Continued)

*Primary Examiner* — Marc Duncan
(74) *Attorney, Agent, or Firm* — Cha & Reiter, LLC

(57) ABSTRACT

A method for encoding a channel in a communication system using a Low-Density Parity-Check (LDPC) code. The method includes generating a plurality of column groups by grouping (categorizing) columns corresponding to an information word in a parity-check matrix of the LDPC code, and ordering the column groups; determining a range of an information word desired to be obtained by performing shortening; based on the determined range of the information word, performing column group-by-column group shortening on the column groups in order according to a predetermined shortening pattern; and LDPC encoding the shortened information word.

20 Claims, 8 Drawing Sheets

U.S. PATENT DOCUMENTS

| | | | |
|---|---|---|---|
| 7,483,496 B2 * | 1/2009 | Eroz et al. | 375/316 |
| 7,631,246 B2 * | 12/2009 | Shen et al. | 714/774 |
| 7,661,037 B2 * | 2/2010 | Niu et al. | 714/701 |
| 7,664,008 B2 * | 2/2010 | Stolpman et al. | 370/203 |
| 7,673,226 B2 * | 3/2010 | Eroz et al. | 714/801 |
| 7,707,479 B2 * | 4/2010 | Niu et al. | 714/758 |
| 7,890,844 B2 * | 2/2011 | Jeong et al. | 714/784 |
| 2004/0098659 A1 * | 5/2004 | Bjerke et al. | 714/776 |
| 2005/0283707 A1 * | 12/2005 | Sharon et al. | 714/758 |
| 2005/0289437 A1 * | 12/2005 | Oh et al. | 714/758 |
| 2006/0218459 A1 * | 9/2006 | Hedberg | 714/752 |
| 2008/0022191 A1 * | 1/2008 | Stolpman et al. | 714/776 |
| 2009/0217129 A1 * | 8/2009 | Myung et al. | 714/752 |
| 2009/0259915 A1 * | 10/2009 | Livshitz et al. | 714/758 |
| 2011/0307755 A1 * | 12/2011 | Livshitz et al. | 714/752 |

FOREIGN PATENT DOCUMENTS

| | | |
|---|---|---|
| KR | 2006-41925 | 5/2006 |
| KR | 2006-45862 | 5/2006 |
| RU | 2310274 C1 | 11/2007 |
| WO | WO 2005/109662 | 11/2005 |

OTHER PUBLICATIONS

Kou, Yu, et al.; "Low-Density Parity-Check Codes Based on Finite Geometries: A Rediscovery and New Results;" IEEE Transactions on Information Theory, vol. 47, No. 7; Nov. 1, 2001; XP011028087.

Lim, Chi-Woo, et al.; Patent Application Publication No. US 2007/0089027 A1; Publication Date: Apr. 19, 2007; "Apparatus and Method for Transmitting/Receiving Signal in a Communication . . . ;". . . .

Livshitz, Michael; Patent Application Publication No: US 2007/0094580 A1; Publication Date: Apr. 26, 2007; "Method for Selecting Low Density Parity Check (LDPC) Code Used for . . . ;". . . .

European Broadcasting Union; "Digital Video Broadcasting (DVB); Second Generation Framing Structure, Channel Coding and Modulation Systems . . . ;" ETSI Standards, Lis, Sphia Antipolis, France; vol. BC, No. V1.1.2, Jun. 1, 2006; XP014034070.

* cited by examiner

METHOD AND APPARATUS FOR ENCODING AND DECODING CHANNEL IN A COMMUNICATION SYSTEM USING LOW-DENSITY PARITY-CHECK CODES

CLAIM OF PRIORITY

This application claims the benefit of priority under 35 U.S.C. §119(a) from a Korean Patent Application filed in the Korean Intellectual Property Office on Dec. 6, 2007 and assigned Serial No. 10-2007-126083, a Korean Patent Application filed in the Korean Intellectual Property Office on Dec. 10, 2007 and assigned Serial No. 10-2007-127365, a Korean Patent Application filed in the Korean Intellectual Property Office on Feb. 11, 2008 and assigned Serial No. 10-2008-12082, and a Korean Patent Application filed in the Korean Intellectual Property Office on Mar. 14, 2008 and assigned Serial No. 10-2008-23848, the disclosures of all of which are incorporated herein by reference in its entirety.

BACKGROUND OF THE INVENTION

1. Field of the Invention

The present invention relates generally to a communication system using Low-Density Parity-Check (LDPC) codes, and in particular, to a channel encoding/decoding method and apparatus for generating LDPC codes having various codeword lengths and code rates from a given LDPC code.

2. Description of the Related Art

In wireless communication systems, the link performance significantly decreases due to various noises in channels, a fading phenomenon, and Inter-Symbol Interference (ISI). Therefore, in order to realize high-speed digital communication systems requiring high data throughput and reliability, such as the next-generation mobile communication, digital broadcasting, and portable internet, it is necessary to develop a technology for eliminating noise, fading, and ISI. Recently, an intensive study of an error-correcting code has been conducted as a method for increasing communication reliability by efficiently recovering distorted information.

An LDPC code, first introduced by Gallager in 1960s, has lost favor over time due to its implementation complexity which could not be resolved by the technology at that time. However, as the turbo code, which was discovered by Berrou, Glavieux, and Thitimajshima in 1993, shows the performance approximating Shannon's channel limit, research has been conducted on iterative decoding and channel encoding based on a graph along with analyses on performance and characteristic of the turbo code. Due to this research, the LDPC code was restudied in the late 1990s, and proved that LDPC code has performance approximating the Shannon's channel limit if it undergoes decoding by applying iterative decoding based on a sum-product algorithm on a Tanner graph (a special case of a factor graph) corresponding to the LDPC code.

The LDPC code is typically represented using a graph representation technique, and many characteristics can be analyzed through the methods based on graph theory, algebra, and probability theory. Generally, a graph model of channel codes is useful for description of codes, and by mapping information on encoded bits to vertexes in the graph and mapping relations between the bits to edges in the graph, it is possible to consider a communication network in which the vertexes exchange predetermined messages through the edges, thus making it possible to derive a natural decoding algorithm. For example, a decoding algorithm derived from a trellis, which can be regarded as a kind of graph, can include the well-known Viterbi algorithm and a Bahl, Cocke, Jelinek and Raviv (BCJR) algorithm.

The LDPC code is generally defined as a parity-check matrix, and can be represented using a bipartite graph, which is referred to as a Tanner graph. The bipartite graph means that vertexes constituting the graph are divided into two different types, and the LDPC code is represented with the bipartite graph composed of vertexes, some of which are called variable nodes and the other of which are called check nodes. The variable nodes are one-to-one mapped to the encoded bits.

With reference to FIGS. 1 and 2, a description will be made of a graph representation method for the LDPC code.

FIG. 1 shows an example of a parity-check matrix $H_1$ of the LDPC code composed of 4 rows and 8 columns. Referring to FIG. 1, since the number of columns is 8, the parity-check matrix $H_1$ means an LDPC code that generates a length-8 codeword, and the columns are mapped to 8 encoded bits.

FIG. 2 is a diagram illustrating a Tanner graph corresponding to $H_1$ of FIG. 1.

Referring to FIG. 2, the Tanner graph of the LDPC code is composed of 8 variable nodes $x_1$ (202), $x_2$ (204), $x_3$ (206), $x_4$ (208), $x_5$ (210), $x_6$ (212), $x_7$ (214) and $x_8$ (216), and 4 check nodes 218, 220, 222 and 224. An $i^{th}$ column and a $j^{th}$ row in the parity-check matrix $H_1$ of the LDPC code are mapped to a variable node $x_i$ and a $j^{th}$ check node, respectively. In addition, a value of 1, i.e., a non-zero value, at the point where an $i^{th}$ column and a $j^{th}$ row in the parity-check matrix $H_1$ of the LDPC code cross each other, means that there is an edge between the variable node $x_i$ and the $j^{th}$ check node on the Tanner graph of FIG. 2.

In the Tanner graph of the LDPC code, a degree of the variable node and a check node means the number of edges connected to each respective node, and the degree is equal to the number of non-zero entries in a column or row corresponding to the associated node in the parity-check matrix of the LDPC code. For example, in FIG. 2, degrees of the variable nodes $x_1$ (202), $x_2$ (204), $x_3$ (206), $x_4$ (208), $x_5$ (210), $x_6$ (212), $x_7$ (214) and $x_8$ (216) are 4, 3, 3, 3, 2, 2, 2 and 2, respectively, and degrees of check nodes 218, 220, 222 and 224 are 6, 5, 5 and 5, respectively. In addition, the numbers of non-zero entries in the columns of the parity-check matrix $H_1$ of FIG. 1, which correspond to the variable nodes of FIG. 2, are coincident with their degrees 4, 3, 3, 3, 2, 2, 2 and 2, and the numbers of non-zero entries in the rows of the parity-check matrix $H_1$ of FIG. 1, which correspond to the check nodes of FIG. 2, are coincident with their degrees 6, 5, 5 and 5.

In order to represent degree distribution for the nodes of the LDPC code, a ratio of the number of degree-i variable nodes to the total number of variable nodes is defined as $f_i$, and a ratio of the number of degree-j check nodes to the total number of check nodes is defined as $g_j$. For example, for the LDPC code corresponding to FIGS. 1 and 2, $f_2=4/8$, $f_3=3/8$, $f_4=1/8$, and $f_i=0$ for $i \neq 2, 3, 4$; and $g_5=3/4$, $g_6=1/4$, and $g_j=0$ for $j \neq 5, 6$. When a length of the LDPC code is defined as N, i.e., the number of columns is defined as N, and when the number of rows is defined as N/2, the density of non-zero entries in the entire parity-check matrix having the above degree distribution is computed as Equation (1).

$$\frac{2f_2 N + 3f_3 N + 4f_4 N}{N \cdot N/2} = \frac{5.25}{N} \qquad (1)$$

In Equation (1), as N increases, the density of '1's in the parity-check matrix decreases. Generally, as for the LDPC code, since the code length N is inversely proportional to the density of non-zero entries, the LDPC code with a large N has a very low density. The wording 'low-density' in the name of the LDPC code originates from the above-mentioned relationship.

Next, with reference to FIG. 3, a description will be made of characteristics of a parity-check matrix of a structured LDPC code to be applied in the present invention. FIG. 3 schematically illustrates an LDPC code adopted as the standard technology in DVB-S2, which is one of the European digital broadcasting standards.

In FIG. 3, $N_1$ denotes a length of an LDPC codeword, $K_1$ provides a length of an information word, and $(N_1-K_1)$ provides a parity length. Further, $M_1$ and q are determined to satisfy $q=(N_1-K_1)/M_1$. Preferably, $K_1/M_1$ should be an integer. For convenience, the parity-check matrix of FIG. 3 is called a first parity-check matrix $H_1$.

Referring again to FIG. 3, a structure of a parity part, i.e., $K_1^{th}$ column through $(N_1-1)^{th}$ column, in the parity-check matrix, has a dual diagonal shape. Therefore, as for degree distribution over columns corresponding to the parity part, all columns have a degree '2', except for the last column having a degree '1'.

In the parity-check matrix, a structure of an information part, i.e., $0^{th}$ column through $(K_1-1)^{th}$ column, is made using the following rules.

Rule 1: It generates a total of $K_1/M_1$ column groups by grouping $K_1$ columns corresponding to the information word in the parity-check matrix into multiple groups of $M_1$ columns. A method for forming columns belonging to each column group follows Rule 2 below.

Rule 2: It first determines positions of '1's in each $0^{th}$ column in $i^{th}$ column groups (where $i=1, \ldots, K_1/M_1$). When a degree of a $0^{th}$ column in each $i^{th}$ column group is denoted by $D_i$, if positions of rows with 1 are assumed to be $R_{i,0}^{(1)}$, $R_{i,0}^{(2)}, \ldots, R_{i,0}^{(D_i)}$, positions $R_{i,j}^{(k)}$ ($k=1,2,\ldots,D_i$) of rows with 1 are defined as Equation (2), in a $j^{th}$ column (where $j=1,2,\ldots,M_1-1$) in an $i^{th}$ column group.

$$R_{i,j}^{(k)} = R_{i,(j-1)}^{(k)} + q \bmod(N_1-K_1),$$

$$k=1,2,\ldots,D_i, i=1,\ldots,K_1/M_1, j=1,\ldots,M_1-1 \quad (2)$$

According to the above rules, it is can be appreciated that degrees of columns belonging to an $i^{th}$ column group are all equal to $D_i$. For a better understanding of a structure of a DVB-S2 LDPC code that stores information on the parity-check matrix according to the above rules, the following detailed example will be described.

As a detailed example, for $N_1=30$, $K_1=15$, $M_1=6$ and $q=3$, three sequences for the information on the position of rows with 1 (hereafter, these sequences are called "Weight-1 Position Sequences" for convenience' sake) for $0^{th}$ columns in 3 column groups can be expressed as;

$$R_{1,0}^{(1)}=0, R_{1,0}^{(2)}=1, R_{1,0}^{(3)}=2,$$

$$R_{2,0}^{(1)}=0, R_{2,0}^{(2)}=11, R_{2,0}^{(3)}=13,$$

$$R_{3,0}^{(1)}=0, R_{3,0}^{(2)}=10, R_{3,0}^{(3)}=14.$$

Regarding the weight-1 position sequence for $0^{th}$ columns in each column group, only the corresponding position sequences can be expressed as follows for each column group, for convenience' sake. For example:

0 1 2
0 11 13
0 10 14.

In other words, the $i^{th}$ weight-1 position sequence in the $i^{th}$ line sequentially represents the information on the position of rows with 1 for the column group.

It is possible to generate an LDPC code having the same concept as that of a DVB-S2 LDPC code of FIG. 4, by forming a parity-check matrix using the information corresponding to the detailed example, and Rule 1 and Rule 2.

It is known that the DVB-S2 LDPC code designed in accordance with Rule 1 and Rule 2 can be efficiently encoded using the structural shape. A process of performing LDPC encoding using the DVB-S2 based parity-check matrix will be described below by way of example.

In the following exemplary description, as a detailed example, a DVB-S2 LDPC code with $N_1=16200$, $K_1=10800$, $M_1=360$ and $q=15$ undergoes an encoding process. For convenience, information bits having a length $K_1$ are represented as $(i_0, i_1, \ldots, i_{K_1-1})$, and parity bits having a length $(N_1-K_1)$ are expressed as $(p_0, p_1, \ldots, p_{N_1-K_1-1})$.

Step 1: An encoder initializes parity bits as follows:

$$p_0=p_1=\ldots=p_{N_1-K_1-1}=0$$

Step 2: The encoder reads information on a row where 1 is located within the first column group of an information word, from the $0^{th}$ weight-1 position sequence of the stored sequences indicating the parity-check matrix.

0 2084 1613 1548 1286 1460 3196 4297 2481 3369 3451 4620 2622

$$R_{1,0}^{(1)}=0, R_{1,0}^{(2)}=2048, R_{1,0}^{(3)}=1613, R_{1,0}^{(4)}=1548,$$
$$R_{1,0}^{(5)}=1286,$$

$$R_{1,0}^{(6)}=1460, R_{1,0}^{(7)}=3196, R_{1,0}^{(8)}=4297,$$
$$R_{1,0}^{(9)}=2481, R_{1,0}^{(10)}=3369,$$

$$R_{1,0}^{(11)}=3451, R_{1,0}^{(12)}=4620, R_{1,0}^{(13)}=2622.$$

The encoder updates particular parity bits $p_x$ in accordance with Equation (3) using the read information and the first information bit $i_0$. Herein, x means a value of $R_{1,0}^{(k)}$ for $k=1,2,\ldots,13$.

$$p_0=p_0 \oplus i_0, p_{2064}=p_{2064} \oplus i_0, p_{1613}=p_{1613} \oplus i_0,$$

$$p_{1548}=p_{1548} \oplus i_0, p_{1286}=p_{1286} \oplus i_0, p_{1460}=p_{1460} \oplus i_0,$$

$$p_{3196}=p_{3196} \oplus i_0, p_{4297}=p_{4297} \oplus i_0, p_{2481}=p_{2481} \oplus i_0,$$

$$p_{3369}=p_{3369} \oplus i_0, p_{3451}=p_{3451} \oplus i_0, p_{4620}=p_{4620} \oplus i_0,$$

$$p_{2622}=p_{2622} \oplus i_0 \quad (3)$$

In Equation (3), $p_x=p_x \oplus i_0$ can also be expressed as $p_x \leftarrow p_x \oplus i_0$, and $\oplus$ means binary addition.

Step 3: The encoder first finds out a value of Equation (4) for the next 359 information bits $i_m$ (where $m=1,2,\ldots,359$) after $i_0$.

$$\{x+(m \bmod M_1) \times q\} \bmod (N_1-K_1), M_1=360, m= 1,2,\ldots,359 \quad (4)$$

In Equation (4), x means a value of $R_{1,0}^{(k)}$ for $k=1,2,\ldots,13$. It should be noted that Equation (4) has the same concept as Equation (2).

Next, the encoder performs an operation similar to Equation (3) using the value found in Equation (4). That is, the encoder updates $p_{\{x+(m \bmod M_1) \times q\} \bmod(N_1-K_1)}$ for $i_m$. For example, for $m=1$, i.e., for $i_1$, the encoder updates parity bits $p_{(x+q) \bmod(N_1-K_1)}$ as defined in Equation (5).

$$p_{15}=p_{15} \oplus i_1, p_{2099}=p_{2099} \oplus i_1, p_{1628}=p_{1628} \oplus i_1,$$

$$p_{1563}=p_{1563} \oplus i_1, p_{1301}=p_{1301} \oplus i_1, p_{1475}=p_{1475} \oplus i_1,$$

$$p_{3211} = p_{3211} \oplus i_1, p_{4312} = p_{4312} \oplus i_1, p_{2496} = p_{2496} \oplus i_1,$$

$$p_{3384} = p_{3384} \oplus i_1, p_{3466} = p_{3466} \oplus i_1, p_{4635} = p_{4635} \oplus i_1,$$

$$p_{2637} = p_{2637} \oplus i_1 \quad (5)$$

It should be noted that q=15 in Equation (5). The encoder performs the above process for m=1, 2, ..., 359, in the same manner as shown above.

Step 4: As in Step 2, the encoder reads information of $R_{2,0}^{(k)}$(k=1, 2, ..., 13), the $1^{st}$ weight-1 position sequence, for a $361^{st}$ information bit $i_{360}$, and updates particular $p_x$, where x means $R_{2,0}^{(k)}$. The encoder updates $P_{\{x+(m \bmod M_1) \times q\} \bmod(N_1-K_1)}$, m=361,362, ..., 719 by similarly applying Equation (4) to the next 359 information bits $i_{361}$, $i_{362}$, ..., $i_{719}$ after $i_{360}$.

Step 5: The encoder repeats Steps 2, 3 and 4 for all groups each having 360 information bits.

Step 6: The encoder finally determines parity bits using Equation (6).

$$p_i = p_i \oplus p_{i-1}, i=1,2,\ldots,N_1-K_1-1 \quad (6)$$

The parity bits $p_i$ of Equation (6) are parity bits that underwent LDPC encoding.

As described above, DVB-S2 performs encoding through the process of Step 1 through Step 6.

In order to apply the LDPC code to the actual communication system, the LDPC code should be designed to be suitable for the data rate required in the communication system. Particularly, not only in an adaptive communication system employing a Hybrid Automatic Retransmission Request (HARQ) scheme and an Adaptive Modulation and Coding (AMC) scheme, but also in a communication system supporting various broadcast services, LDPC codes having various codeword lengths are needed to support various data rates according to the system requirements.

However, as described above, the LDPC code used in the DVB-S2 system has only two types of codeword lengths due to its limited use, and each type of the LDPC code needs an independent parity-check matrix. For these reasons, there is a long-felt need in the art for a method for supporting various codeword lengths to increase extendibility and flexibility of the system. Particularly, in the DVB-S2 system, transmission of data comprising several hundreds to thousands of bits is needed for transmission of signaling information. However, since only 16200 and 64800 are available for a length of the DVB-S2 LDPC code, it is necessary to support various codeword lengths.

In addition, since storing independent parity-check matrix separately for each codeword length of the LDPC code reduces the overall memory efficiency, there is a demand for a scheme capable of efficiently supporting various codeword lengths from the given existing parity-check matrix, without designing a new parity-check matrix.

SUMMARY OF THE INVENTION

An exemplary aspect of the present invention is to provide a channel encoding/decoding method and apparatus for generating LDPC codes having different codeword lengths from a given LDPC code, using shortening or puncturing in a communication system using LDPC codes.

Another exemplary aspect of the present invention is to provide a channel encoding/decoding method and apparatus for guaranteeing the optimal performance with regard to DVB-S2 architecture in a communication system using LDPC codes.

According to an exemplary aspect of the present invention, there is provided a method for encoding a channel in a communication system using a Low-Density Parity-Check (LDPC) code. The method may include, for example, generating a plurality of column groups by grouping columns corresponding to an information word in a parity-check matrix of the LDPC code, and ordering the column groups; determining a range of an information word desired to be obtained by performing shortening; based on the determined range of the information word, performing column group-by-column group shortening on the column groups in order according to a predetermined shortening pattern; and LDPC encoding the shortened information word.

According to another exemplary aspect of the present invention, there is provided a method for encoding a channel in a communication system using a Low-Density Parity-Check (LDPC) code. The method may include generating a plurality of column groups by grouping columns corresponding to an information word in a parity-check matrix of the LDPC code, and ordering the column groups; determining a range of an information word desired to be obtained by performing shortening; based on the determined range of the information word, performing column group-by-column group shortening on the column groups in order according to a predetermined shortening pattern; and LDPC encoding the shortened information word; wherein performing column group-by-column group shortening comprises including 168 Bose-Chaudhuri-Hocquenghem (BCH) parity bits in an information word desired to be obtained by performing shortening, and shortening columns except for columns in positions corresponding to the 168 BCH parity bits.

According to still another exemplary aspect of the present invention, there is provided an apparatus for encoding a channel in a communication system using a Low-Density Parity-Check (LDPC) code. The apparatus includes a parity-check matrix extractor for generating a plurality of column groups by grouping columns corresponding to an information word in a parity-check matrix of the LDPC code, and ordering the column groups; a shortening pattern applier for determining a range of an information word desired to be obtained by performing shortening, and based on the determined range of the information word, performing column group-by-column group shortening on the column groups in order according to a predetermined shortening pattern; and an encoder for LDPC encoding the shortened information word.

According to yet another exemplary aspect of the present invention, there is provided an apparatus for encoding a channel in a communication system using a Low-Density Parity-Check (LDPC) code. The apparatus includes a parity-check matrix extractor for generating a plurality of column groups by grouping columns corresponding to an information word in a parity-check matrix of the LDPC code, and ordering the column groups; a shortening pattern applier for determining a range of an information word desired to be obtained by performing shortening, and based on the determined range of the information word, and for performing column group-by-column group shortening on the column groups in order according to a predetermined shortening pattern; and an encoder for LDPC encoding the shortened information word; wherein in performing column group-by-column group shortening, the shortening pattern applier includes, for example, 168 Bose-Chaudhuri-Hocquenghem (BCH) parity bits in an information word desired to be obtained by performing shortening, and by shortening columns except for columns in positions corresponding to the 168 BCH parity bits.

According to still another exemplar aspect of the present invention, there is provided a method for decoding a channel in a communication system using a Low-Density Parity-Check (LDPC) code. The method includes, for example, demodulating a signal transmitted from a transmitter; determining a position of a shortened bit by estimating information on a shortening pattern of an LDPC code from the demodulated signal; and decoding data using the determined position of the shortened bit.

According to even still another exemplary aspect of the present invention, there is provided an apparatus for decoding a channel in a communication system using a Low-Density Parity-Check (LDPC) code. The apparatus includes, for example, a demodulator for demodulating a signal transmitted from a transmitter; a shortening pattern determiner for determining a position of a shortened bit by estimating information on a shortening pattern of an LDPC code from the demodulated signal; and a decoder for decoding data using the determined position of the shortened bit.

BRIEF DESCRIPTION OF THE DRAWINGS

The above and other aspects, features and advantages of the present invention will become more apparent from the following detailed description when taken in conjunction with the accompanying drawings in which.

Throughout the drawings, the same drawing reference numerals will be understood to refer to the same elements, features and structures.

DETAILED DESCRIPTION

Preferred exemplary embodiments of the present invention will now be described in detail with reference to the annexed drawings. In the following description, a detailed description of known functions and exemplary configurations incorporated herein may have been omitted for clarity and conciseness when their inclusion might obscure appreciation of the invention by a person of ordinary skill in the art.

The present invention provides a method for supporting LDPC codes having various codeword lengths using a parity-check matrix of a structured LDPC code of a particular type. In addition, the present invention provides an apparatus for supporting various codeword lengths in a communication system using LDPC codes of a particular type, and a method for controlling the same. Particularly, the present invention provides a method and apparatus for generating an LDPC code using a parity-check matrix of a given LDPC code, the generated LDPC code being shorter in length than the given LDPC code.

Figure 5:
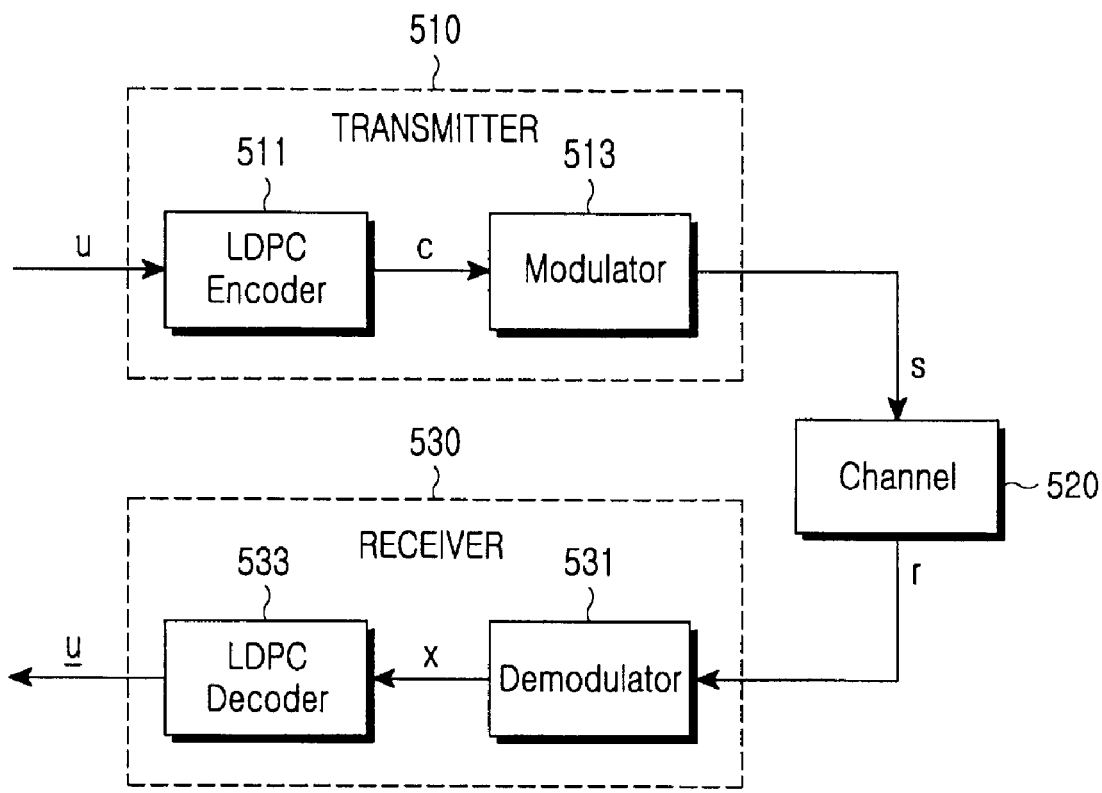
FIG. 5 is a block diagram illustrating a structure of a transceiver in a communication system using LDPC codes.

FIG. 5 is a block diagram illustrating a structure of a transceiver in a communication system using LDPC codes.

Referring to FIG. 5, a message u is input to an LDPC encoder 511 in a transmitter 510 before being transmitted to a receiver 530. Then the LDPC encoder 511 encodes the input message u, and outputs the encoded signal to a modulator 513. The modulator 513 modulates the encoded signal, and transmits the modulated signal to the receiver 530 over a wireless channel 520. Then a demodulator 531 in the receiver 530 demodulates the signal transmitted by the transmitter 510, and outputs the demodulated signal to an LDPC decoder 533. Then the LDPC decoder 533 estimates an estimation value $\bar{u}$ of the message based on the data received through the wireless channel 520.

The LDPC encoder 511 generates a parity-check matrix according to a codeword length required by a communication system, using a preset scheme. Particularly, according to the present invention, the LDPC encoder 511 can support various codeword lengths using the LDPC code without the separate need for additional storage information. A detailed operation of the LDPC encoder for supporting various codeword lengths will be described in detail below with reference to FIG. 6.

Figure 6:
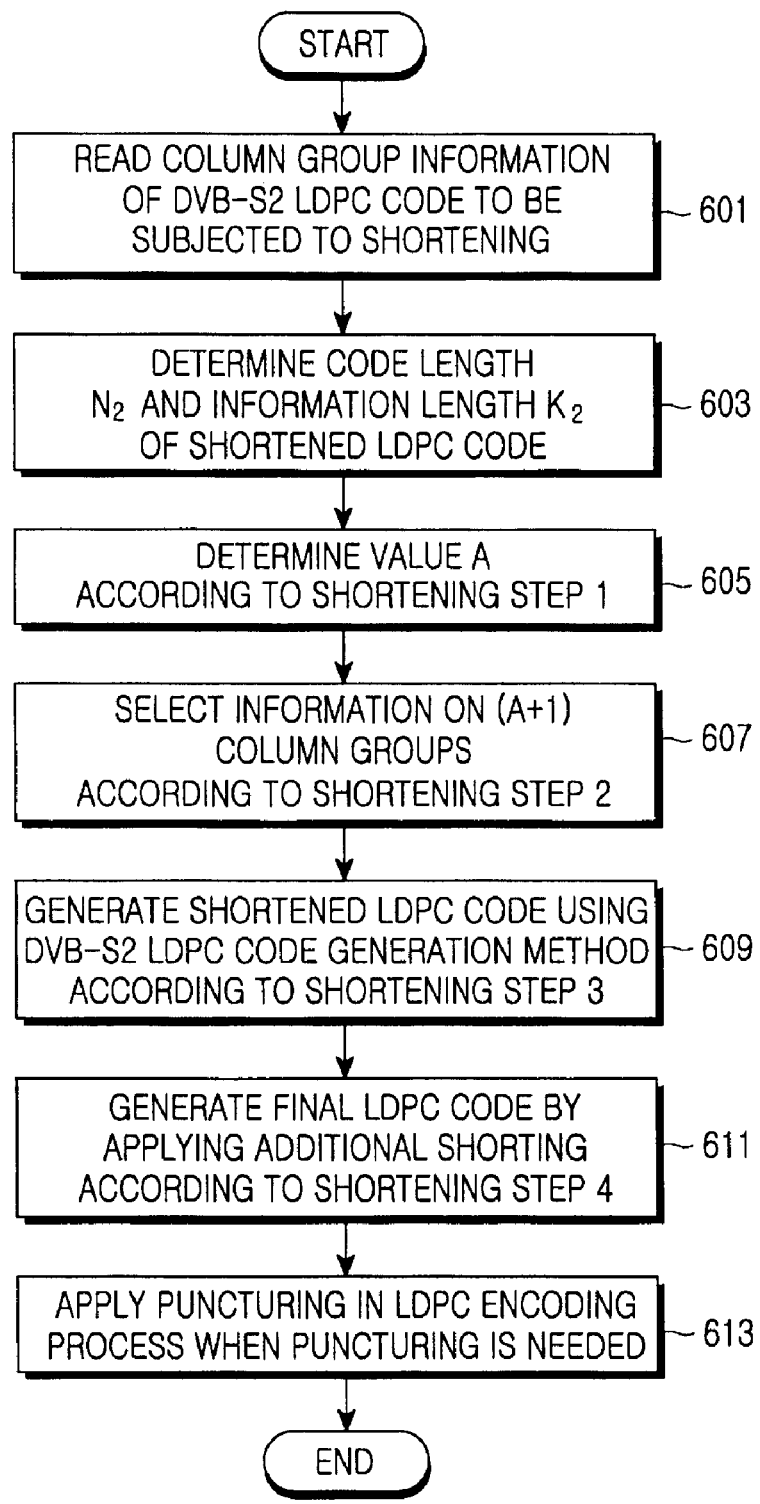
FIG. 6 is a flowchart illustrating a process of generating an LDPC code having a different codeword length from a parity-check matrix of a stored LDPC code according to an exemplary embodiment of the present invention.

FIG. 6 is a flowchart illustrating an encoding operation of an LDPC encoder according to an exemplary embodiment of the present invention. To be specific, FIG. 6 illustrates a method for generating LDPC codes having different codeword lengths from a parity-check matrix of a previously stored LDPC code.

Herein, the method of supporting various codeword lengths uses a shortening technique and a puncturing technique.

The term 'shortening technique' as used herein means a method that does not substantially use a specified part of a given particular parity-check matrix. For a better understanding of the shortening technique, a parity-check matrix of the DVB-S2 LDPC code shown in FIG. 3 will be described in detail.

Figures 1, 2:
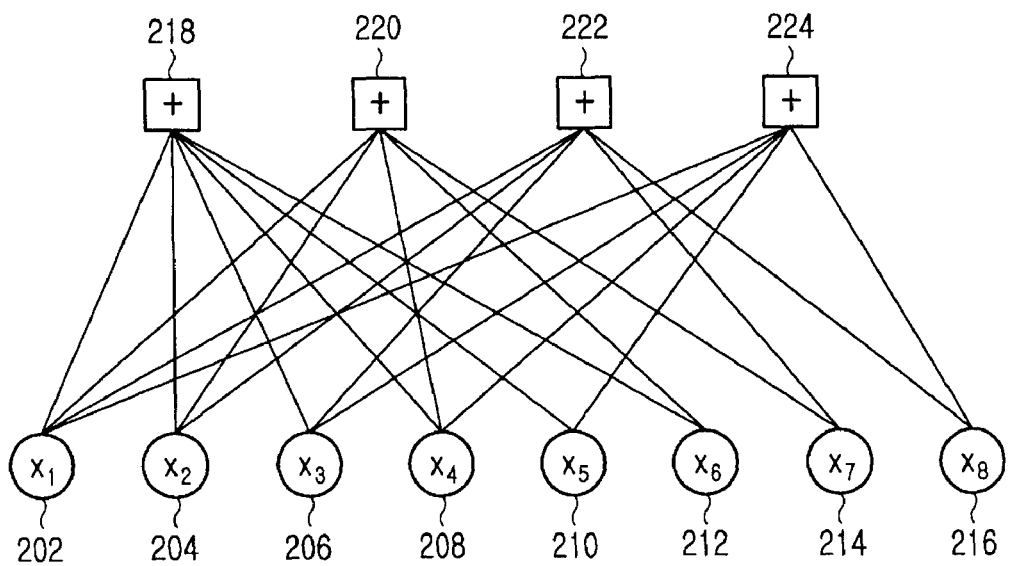
FIG. 1 is a diagram illustrating an exemplary parity-check matrix of a length-8 LDPC code.
FIG. 2 is a diagram illustrating a Tanner graph for an exemplary parity-check matrix of a length-8 LDPC code.
Figure 3:
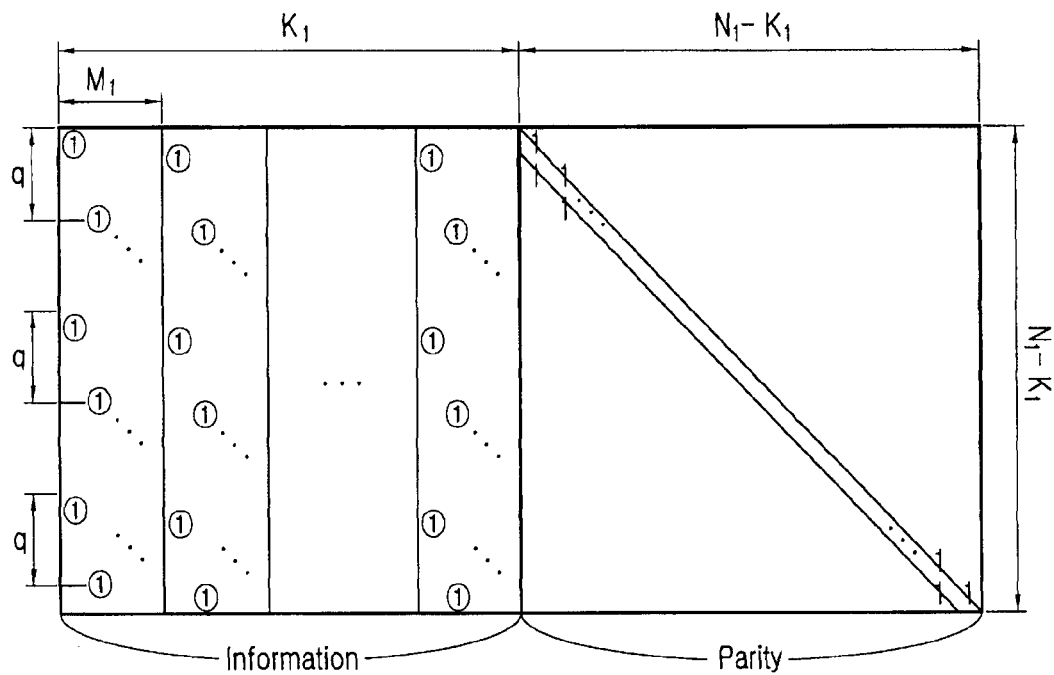
FIG. 3 is a diagram illustrating a schematic structure of a DVB-S2 LDPC code.
Figure 4:
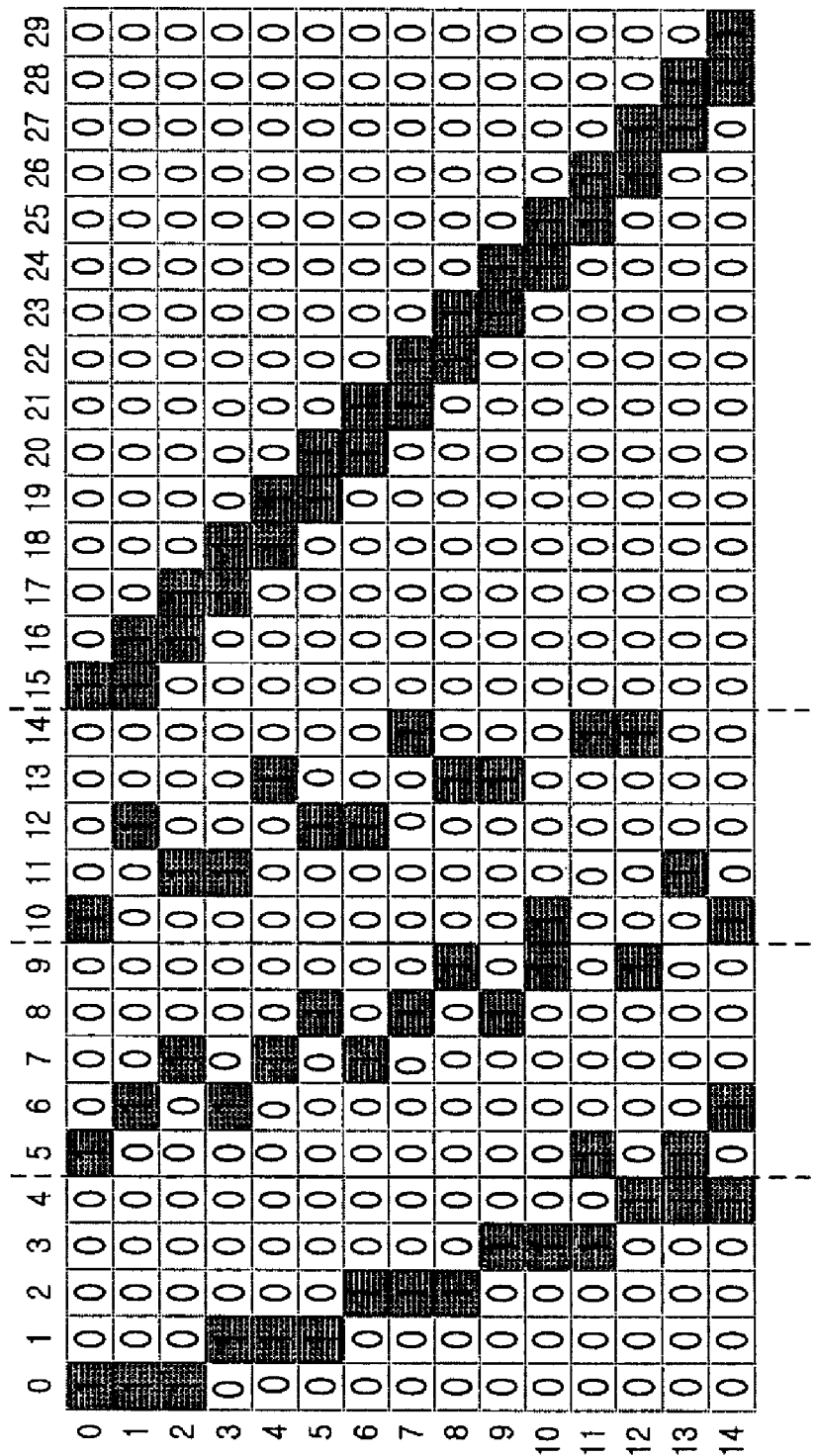
FIG. 4 is a diagram illustrating an exemplary parity-check matrix of a DVB-S2 LDPC code.

Referring now to the parity-check matrix of the DVB-S2 LDPC code shown in FIG. 3, its total length is $N_1$, the leading part corresponds to length-$K_1$ information bits $(i_0, i_1, \ldots, i_{K_1-1})$, and the rear part corresponds to length-$(N_1-K_1)$ parity bits $(p_0, p_1, \ldots, p_{N_1-K_1-1})$. Commonly, the information bits freely have a value of 0 or 1, and the shortening technique limits values of information bits of a particular part which is to be subjected to shortening. For example, shortening $N_s$ information bits $i_0$ through $i_{N_s-1}$ commonly means that $i_0 = i_1 = \ldots = i_{N_s-1} = 0$. In other words, by limiting values for $N_s$ information bits $i_0$ through $i_{N_s-1}$, to 0, the shortening technique can obtain the same effect as substantially not using $N_s$ leading columns in the parity-check matrix of the DVB-S2 LDPC code shown in FIG. 3. The term 'shortening technique' originates from the above-stated limitation operation. Therefore, applying the shortening herein means considering values of the shortened information bits, as 0.

With respect to the shortening technique, when the system is set up, a transmitter and a receiver can share or generate the same position information for the shortened information bits. Therefore, though the transmitter has not transmitted the shortened bits, the receiver performs decoding, knowing that information bits in the positions corresponding to the shortened bits have a value of 0.

In the shortening technique, since a length of a codeword that the transmitter actually transmits is $N_1-N_s$ and a length of an information word is also $K_1-N_s$, the code rate becomes $(K_1-N_s)/(N_1-N_s)$, which is always less than the first given code rate $K_1/N_1$.

Next, the puncturing technique will be described in detail. Generally, the puncturing technique can be applied to both the information bits and parity bits. Although the puncturing technique and the shortening technique are in common in reducing codeword lengths of codes, the puncturing technique, unlike the shortening technique, described herein above, does not have the concept that limits values of particular bits. The puncturing technique is a method for simply not transmitting particular information bits or a particular part of generated parity bits, so that a receiver can perform erasure processing on the corresponding bits. In other words, by simply not transmitting bits in $N_p$ predefined positions in a generated length-$N_1$ LDPC codeword, the puncturing technique can obtain the same effect as transmitting a length-$(N_1-N_p)$ LDPC codeword. Since columns corresponding to the bits punctured in the parity-check matrix are all used intact in a decoding process, the puncturing technique is different from the shortening technique.

Since, according to the invention position information for the punctured bits can be equally shared or estimated by the transmitter and the receiver when the system is set up, the receiver performs erasure processing on the corresponding punctured bits, before performing decoding.

In the puncturing technique, since a length of a codeword that the transmitter actually transmits is $N_1-N_p$ and a length of an information word is $K_1$ constantly, the code rate becomes $K_1/(N_1-N_p)$, which is always greater than the first given code rate $K_1/N_1$.

A description will now be made of the exemplary shortening technique and the exemplary puncturing technique suitable for the DVB-S2 LDPC code. The DVB-S2 LDPC code, as mentioned above, is a kind of an LDPC code having a particular structure. Therefore, compared with the normal LDPC code, the DVB-S2 LDPC code can undergo more efficient shortening and puncturing.

For convenience of this example, assume that a codeword length and an information length of an LDPC code are $N_2$ and $K_2$, respectively that the invention desires to finally obtain from the DVB-S2 LDPC code whose codeword length and information length are $N_1$ and $K_1$, respectively, using the shortening technique and the puncturing technique. If $N_1-N_2=N_\Delta$ and $K_1-K_2=K_\Delta$, it is possible to generate the LDPC code whose codeword length and information length are $N_2$ and $K_2$, respectively, by shortening $K_\Delta$ bits and puncturing $(N_\Delta-K_\Delta)$ bits from the parity-check matrix of the DVB-S2 LDPC code. For the generated LDPC code with $N_\Delta>0$ or $K_\Delta>0$, since its code rate $$\frac{K_1-K_\Delta}{N_1-N_\Delta}$$

is generally different from the code rate $K_1/N_1$ of the DVB-S2 LDPC code, its algebraic characteristic changes. For $N_\Delta=K_\Delta$, the LDPC code is generated by applying none of shortening and puncturing or performing only shortening.

However, regarding the DVB-S2 LDPC code, as described in Rule 1 and Rule 2, as one $R_{i,j}^{(k)}$ ($k=1,2,\ldots,D_i$, $i_1=1,\ldots,K_1/M_1$, $i=0,\ldots,M_1-1$) value corresponds to $M_1$ columns, a total of $K_1/N_1$ column groups each have a structural shape. Therefore, the DVB-S2 LDPC code is equal to an LDPC code that does not use $M_1$ columns, if it does not use one $R_{i,j}^{(k)}$ value. The following shortening process is proposed considering such characteristics.

In step 601, the LDPC encoder 511 reads column group information of a DVB-S2 LDPC code to be subjected to shortening. That is, the LDPC encoder 511 reads the stored parity-check matrix information. Thereafter, in step 603, the LDPC encoder 511 determines a codeword length $N_2$ and an information length $K_2$ for a shortened LDPC codeword to transmit actually after shortening. Thereafter, the LDPC encoder 511 performs a shortening process of steps 605 to 611, in which the LDPC encoder 511 performs shortening corresponding to a required information length of an LDPC code, based on the read information of the stored parity-check matrix.

Shortening Step 1: The LDPC encoder 511 determines $$A = \left\lfloor \frac{K_2}{M_1} \right\rfloor$$

in step 605, where $\lfloor x \rfloor$ means the maximum integer which is less than or equal to x.

Shortening Step 2: The LDPC encoder 511 selects a sequence for $(A+1)$ column groups among $R_{i,j}^{(k)}$ ($i_1=1,\ldots,K_1/M_1$) in step 607, and the selected sequence is defined as $S_{i,j}^{(k)}$ ($i_1=1,\ldots,A+1$). The LDPC encoder 511 considers that there is no sequence $R_{i,0}^{(k)}$ for the remaining $K_1/M_1-A-1$ column groups.

Shortening Step 3: The LDPC encoder 511 generates a shortened DVB-S2 LDPC code from the A+1 $S_{i,0}^{(k)}$ value s selected in Shortening Step 2, using Rule 1 and Rule 2 in step 609. It should be noted that the shortened LDPC code has an information length of $(A+1)M_1$, which is always greater than or equal to $K_2$.

Shortening Step 4: The LDPC encoder 511 additionally shortens $(A+1)M_1-K_2$ columns from the shortened LDPC code generated in Shortening Step 3 in step 611.

For a description of detailed examples, a detailed description will now be made of a process of generating a new LDPC code whose codeword length is $N_2=4050$ and whose information length is $K_2=1170$, by shortening 12150 bits among the information bits using a DVB-S2 LDPC code that has a characteristic of $N_1=16200$, $K_1=13320$, $M_1=360$ and $q=9$.

Example of Shortening Step 1: The LDPC encoder 511 determines $$A = \left\lfloor \frac{1170}{360} \right\rfloor = 3.$$

Example of Shortening Step 2: The LDPC encoder 511 selects a sequence for 4 column groups among a total of 37 $R_{i,0}^{(k)}$ value s. In this particular example, the LDPC encoder 511 selects the following sequence.

$S_{1,0}^{(1)}=3$, $S_{1,0}^{(2)}=2409$, $S_{1,0}^{(3)}=499$, $S_{1,0}^{(4)}=1482$, $S_{1,0}^{(5)}=908$,
$S_{1,0}^{(6)}=559$, $S_{1,0}^{(7)}=716$, $S_{1,0}^{(8)}=1270$, $S_{1,0}^{(9)}=333$, $S_{1,0}^{(10)}=2508$, $S_{1,0}^{(11)}=2264, S_{1,0}^{(12)}=1702, S_{1,0}^{(13)}=2805,$
$S_{2,0}^{(1)}=6, S_{2,0}^{(2)}=2114, S_{2,0}^{(3)}=842,$
$S_{3,0}^{(1)}=0, S_{3,0}^{(2)}=1885, S_{3,0}^{(3)}=2369,$
$S_{4,0}^{(1)}=7, S_{4,0}^{(2)}=2326, S_{4,0}^{(3)}=1579.$

Example of Shortening Step 3: The LDPC encoder 511 generates a shortened DVB-S2 LDPC code from the 4 $S_{i,0}^{(k)}$ values selected in Example of Shortening Step 2, using Rule 1 and Rule 2. For the shortened LDPC code, a length of its information word is 4×360=1440.

Example of Shortening Step 4: The LDPC encoder 511 additionally shortens 1440−1170=270 columns from the shortened LDPC code generated in Example of Shortening Step 3. The LDPC encoder 511 performs encoding based on the shortened LDPC code.

According to the exemplary embodiment, since sequence information for $K_1/M_1−A−1=13320/360−4=33$ column groups among $R_{i,0}^{(k)}(i_1=1,\ldots,K_1/M_1)$ values are not used, which is equivalent to shortening a total of 33×360=11880 bits in the Example of Shortening Step 2. In addition, since the LDPC encoder 511 has additionally shortened 270 information bits through the Example of Shortening Step 3 and the Example of Shortening Step 4, it is finally equivalent to shortening 12150 information bits. Therefore, the result of the embodiment provides a shortened LDPC code with a codeword length $N_2=4050$ and an information length $K_2=1170$.

As described above, the present invention can apply an efficient shortening technique that, compared with a bit-by-bit shortening technique which is commonly used for shortening of the DVB-S2 LDPC code, employs a method of not using information on column groups of the DVB-S2 LDPC code depending on the structural features of the DVB-S2 LDPC code.

Selection criteria of a sequence for a column group can be summarized as follows in Step 2 in the shortening process of the DVB-S2 LDPC code.

Criterion 1: The LDPC encoder 511 selects a shortened LDPC code with a codeword length $N_2$ and an information length $K_2$, obtained by performing shortening on a DVB-S2 LDPC code with a codeword length $N_1$ and an information length $K_1$, degree distribution of the selected shortened LDPC code being almost similar to the optimal degree distribution of the normal LDPC code with a codeword length $N_2$ and an information length $K_2$.

Criterion 2: The LDPC encoder 511 selects a code having the good cycle characteristic on the Tanner graph among the shortened codes selected in Criterion 1. In the present invention, regarding a criterion for a cycle characteristic, the LDPC encoder 511 selects a case where the minimum-length cycles in the Tanner graph is as large as possible and the number of the minimum-length cycles is as small possible.

Although the optimal degree distribution of the normal LDPC code can be found out in Criterion 1 using a density evolution analysis method, a detailed description thereof will be omitted since it is irrelevant to the understanding of the present invention.

If the number of selections of a weight-1 position sequence for the column group is not great, the LDPC encoder 511 may select a weight-1 position sequence for the column group having the best performance by fully searching all the cases regardless of Criterion 1 and Criterion 2. However, the selection criteria for column groups, applied in Shortening Step 2 of the DVB-S2 LDPC code, can increase its efficiency by selecting an LDPC code satisfying the both conditions when the number of selections of the weight-1 position sequence for the column group is too large.

To describe an example of a good sequence obtained by applying the selection criteria of a weight-1 position sequence for the column group, a DVB-S2 code with $N_1=16200$, $K_1=3240$, $M_1=360$ and q=36 will be considered. The DVB-S2 LDPC code has the following weight-1 position sequence on column groups.

6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

The $i^{th}$ weight-1 position sequence in the $i^{th}$ line sequentially represents the information on the position of rows with 1 for the $i^{th}$ column group. Therefore, it can be appreciated that the DVB-S2 LDPC code is composed of 9 column groups and its information length is 9□360=3240. If a codeword length and an information length desired to be obtained by performing shortening are $N_2$ and $K_2$, respectively, it is possible to find out the optimized shortening pattern using Shortening Step 1 through Shortening Step 4.

However, when values of $N_2$ and $K_2$ required by the system are highly variable, the optimized shortening pattern may have no correlation according to the value of $N_2$. For example, assuming that the optimal selection for a case necessary for shortening 2 column groups from the DVB-S2 LDPC code is not using information on rows with 1 in $4^{th}$ and $8^{th}$ column groups, since selecting and shortening $1^{st}$, $5^{th}$ and $6^{th}$ column groups can also be optimal when selecting 3 column groups, they have no correlation with each other. Therefore, when values of $N_2$ and $K_2$ required by the system are highly variable, it is undesirably necessary to store all shortening patterns optimized according to a value of $K_2$, for the optimized performance.

Thus, if values of $N_2$ and $K_2$ required by the system are highly variable, suboptimal shortening patterns can be found using the following method, for system efficiency.

First, assume that selection of 1 column group is needed for shortening. In this case, since the number of selectable column groups is only 1 in an optimal sense, it is possible to select the highest-performance column group. Next, when there is a need for selection of 2 column groups for shortening, the LDPC encoder 511 selects a column group showing the best performance among the remaining column groups, including the selected 1 column group. In the same manner, when there is a need for selection of i column groups for shortening, the LDPC encoder 511 selects one highest-performance column group among the remaining column groups, including (i−1) column groups selected in the previous step for shortening.

This method of shortening, though it cannot guarantee the optimal selection, can have stabilized performance from one shortening pattern regardless of a change in the value of $K_2$.

For a detailed example, when values of $N_2$ and $K_2$ required by the system are highly variable, it is possible to find out suboptimal shortening patterns according to $N_2$ and $K_2$, for 9 cases shown in Table 1. Herein, $N_2=N_1−K_2$, since the puncturing technique is not considered.

TABLE 1

| Range of $K_2$ | Shortening Method |
| --- | --- |
| 1) $2880 \leq K_2 < 3240$ | Shortens $3240-K_2$ bits from an information word corresponding to the $8^{th}$ sequence<br>6189 4241 2343<br>for the $8^{th}$ column group among the weight-1 position sequences. |
| 2) $2520 \leq K_2 < 2880$ | Shortens all columns included in the column group, which correspond to the $8^{th}$ sequence among the weight-1 position sequences, and additionally shortens $2880-K_2$ bits from an information word corresponding to the $4^{th}$ sequence<br>11869 3708 5981 8718 4908 10650 6805 3334 2627 10461 9285 11120<br>for the $4^{th}$ column group. |
| 3) $2160 \leq K_2 < 2520$ | Shortens all columns included in the column group, which correspond to the $8^{th}$ and $4^{th}$ sequences among the weight-1 position sequences, and additionally shortens $2520-K_2$ bits from an information word corresponding to the $7^{th}$ sequence<br>1360 12010 12202<br>for the $7^{th}$ column group. |
| 4) $1800 \leq K_2 < 2160$ | Shortens all columns included in the column group, which correspond to the $8^{th}$, $4^{th}$ and $7^{th}$ sequences among the weight-1 position sequences, and additionally shortens $2160-K_2$ bits from an information word corresponding to the $6^{th}$ sequence<br>3385 10854 5747<br>for the $6^{th}$ column group. |
| 5) $1440 \leq K_2 < 1800$ | Shortens all columns included in the column group, which correspond to the $8^{th}$, $4^{th}$, $7^{th}$ and $6^{th}$ sequences among the weight-1 position sequences, and additionally shortens $1880-K_2$ bits from an information word corresponding to the $3^{rd}$ sequence<br>10774 3613 5208 11177 7676 3549 8746 6583 7239 12265 2674 4292<br>for the $3^{rd}$ column group. |
| 6) $1080 \leq K_2 < 1440$ | Shortens all columns included in the column group, which correspond to the $8^{th}$, $4^{th}$, $7^{th}$, $6^{th}$ and $3^{rd}$ sequences among the weight-1 position sequences, and additionally shortens $1440-K_2$ bits from an information word corresponding to the $5^{th}$ sequence<br>7844 3079 10773<br>for the $5^{th}$ column group. |
| 7) $720 \leq K_2 < 1080$ | Shortens all columns included in the column group, which correspond to the $8^{th}$, $4^{th}$, $7^{th}$, $6^{th}$, $3^{rd}$ and $5^{th}$ sequences among the weight-1 position sequences, and additionally shortens $1080-K_2$ bits from an information word corresponding to the $2^{nd}$ sequence<br>10691 4988 3859 3734 3071 3494 7687 10313 5964 8069 8296 11090<br>for the $2^{nd}$ column group. |
| 8) $528 \leq K_2 < 720$ | Shortens all columns included in the column group, which correspond to the $8^{th}$, $4^{th}$, $7^{th}$, $6^{th}$, $3^{rd}$, $5^{th}$ and $2^{nd}$ sequences among the weight-1 position sequences, and additionally shortens $720-K_2$ bits from an information word corresponding to the $9^{th}$ sequence<br>9840 12726 4977<br>for the $9^{th}$ column group. However, since 168 BCH parity bits are mapped to a part of the column group, which corresponds to the $9^{th}$ sequence, by a DVB-S2 encoding scheme, columns in the positions corresponding to the BCH parity do not undergo shortening. |
| 9) $168 \leq K_2 < 528$ | Shortens all columns included in the column group, which correspond to the $8^{th}$, $4^{th}$, $7^{th}$, $6^{th}$, $3^{rd}$, $5^{th}$, $2^{nd}$ and $9^{th}$ sequences among the weight-1 position sequences, and additionally shortens $528-K_2$ bits from an information word corresponding to the $1^{st}$ sequence<br>6295 9626 304 7695 4839 4936 1660 144 11203 5567 6347 12557<br>for the $1^{st}$ column group. Herein, $K_2 = 168$ means the case where only the columns corresponding to the BCH parity remain in the DVB-S2 LDPC code. In other words, there are no pure information word bits. This is not considered. |

The shortening order in Table 1 is determined by, for example, dividing the information word into 9 intervals, and then applying Criterion 1 and Criterion 2 thereto.

Referring to Table 1, it can be appreciated that all columns corresponding to the $8^{th}$, $4^{th}$, $7^{th}$, $6^{th}$, $3^{rd}$, $5^{th}$, $2^{nd}$, $9^{th}$ and $1^{st}$ sequences included in the column group sequentially undergo shortening according to the required information length for the LDPC code. That is, a value of 0 is mapped to the information bits that will undergo shortening in order of the columns corresponding to the $8^{th}$, $4^{th}$, $7^{th}$, $6^{th}$, $3^{rd}$, $5^{th}$, $2^{nd}$, $9^{th}$ and $1^{st}$ rows according to the required information length. Alternatively, it can also be considered that the meaningful information bits, which are not fixed to 0, are sequentially mapped to the columns corresponding to the $1^{st}$, $9^{th}$, $2^{nd}$, $5^{th}$, $3^{rd}$, $6^{th}$, $7^{th}$, $4^{th}$ and $8^{th}$ sequences according to the information length. The order '8, 4, 7, 6, 3, 5, 2, 9, 1' of the columns can also be expressed as '7, 3, 6, 5, 2, 4, 1, 8, 0', by representing the $1^{st}$ column as a $0^{th}$ block.

In Step 8) and Step 9) in Table 1, since the last 168 bits of the $9^{th}$ column group, or the last column group, in the part corresponding to information bits of the DVB-S2 LDPC code with $N_1=16200$, $K_1=3240$, $M_1=360$ and $q=36$ are mapped to Bose-Chaudhuri-Hocquenghem (BCH) parity bits, they cannot undergo shortening. Actually, when a DVB-S2 LDPC code with $N_1=16200$ is designed such that 168 BCH parity bits are always included in LDPC information bits having the lengths $K_1$ and $K_2$.

The shortening order information shown in Table 1 can also be expressed as Table 2, in brief.

TABLE 2

| Major varibles of DVB-S2 LDPC code | $N_1 = 16200$, $K_1 = 3240$, $M_1 = 360$, $q = 36$ |
| --- | --- |
| Range of $K_2$ | Shortening Method |
| 1) $528 \leq K_2 < 3240$ | For an integer $m = \left\lfloor \dfrac{3240 - K_2}{360} \right\rfloor$, shortens all of m column groups corresponding to $\pi(0)^{th}$, $\pi(1)^{th}$, ..., and $\pi(m-1)^{th}$ column groups, and additionally shortens $3240-K_2-360m$ information bits from a $\pi(m)^{th}$ column group. Herein, $\pi$ denotes a permutation function meaning a shortening pattern, and a relationship there between is shown at the bottom of the table. However, when a part of a $\pi(7) = 8^{th}$ column group is shortened, the columns in the positions corresponding to the 168 BCH parity bits are not subjected to shortening. |
| 2) $168 \leq K_2 < 528$ | Shortens all of $\pi(0)^{th}$, $\pi(1)^{th}$, ..., and $\pi(6)^{th}$ column groups, and shortens all columns except for the columns in the positions corresponding to 168 BCH parity bits from the $\pi(7) = 8^{th}$ column group. Further, additionally shortens $528-K_2$ information bits from a $\pi(8) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| --- | --- | --- | --- | --- | --- | --- | --- | --- |
| 7 | 3 | 6 | 5 | 2 | 4 | 1 | 8 | 0 |

For a description of another exemplary embodiment, a DVB-S2 code with $N_1=16200$, $K_1=7200$, $M_1=360$ and $q=25$ will be described. The DVB-S2 LDPC code has the following weight-1 position sequences.

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212

3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450

The $i^{th}$ sequence sequentially represents the information on the position of rows with 1 for an $i^{th}$ column group. Therefore, it can be appreciated that the DVB-S2 LDPC code is composed of 20 column groups, and the information length is 20×360=7200. When the codeword length and the information length desired to be obtained by performing shortening are $N_2$ and $K_2$, respectively, it is possible to find out suboptimal shortening patterns as defined in Table 3.

TABLE 3

| Major varibles of DVB-S2 LDPC code | $N_1$ = 16200, $K_1$ = 7200, $M_1$ = 360, q = 25 |
|---|---|
| Range of $K_2$ | Shortening Method |
| 1) 528 ≤ $K_2$ < 7200 | For an integer m = $\left\lfloor \dfrac{7200 - K_2}{360} \right\rfloor$, shortens all of m column groups corresponding to $\pi(0)^{th}, \pi(1)^{th}, \ldots$, and $\pi(m-1)^{th}$ column groups, and additionally shortens 7200-$K_2$-360m information bits from a $\pi(m)^{th}$ column group. Herein, $\pi$ denotes a permutation function meaning a shortening pattern, and a relationship therebetween is shown at the bottom of the table. However, when a part of a $\pi(18)$ = $19^{th}$ column group is shortened, the columns in the positions corresponding to the 168 BCH parity bits are not subjected to shortening. |
| 2) 168 ≤ $K_2$ < 528 | Shortens all of $\pi(0)^{th}, \pi(1)^{th}, \ldots$, and $\pi(6)^{th}$ column groups, and shortens all columns except for the columns in the positions corresponding to 168 BCH parity bits from the $\pi(18)$ = $19^{th}$ column group. Further, additionally shortens 528-$K_2$ information bits from a $\pi(19)$ = $0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |

| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
|---|---|---|---|---|---|---|---|---|---|
| 9 | 8 | 3 | 2 | 7 | 6 | 5 | 1 | 19 | 0 |

In the shortening process, the additional shortening can be more easily implemented if the process is sequentially performed from the rear or the front of the column group where the additional shortening is achieved.

After step 611 in FIG. 6, when puncturing is needed, the LDPC encoder 511 applies puncturing in an LDPC encoding process in step 613. The puncturing method will be described below in brief.

If a codeword length and an information length of an LDPC code are defined as $N_2$ and $K_2$, respectively, then the invention intends to obtain eventually from the DVB-S2 LDPC code with a codeword length $N_1$ and a information length $K_1$ using the shortening technique and the puncturing technique, and it is given that $N_1-N_2=N_A$ and $K_1-K_2=K_A$, it is possible to get the LDPC code with a codeword length $N_2$ and an information length $K_2$ by shortening $K_A$ bits and puncturing $(N_A-K_A)$ bits from a parity-check matrix of the DVB-S2 LDPC code. Assuming that for convenience' sake, only the parity part is subjected to puncturing, since the parity length is $N_1-K_1$, there is a method of puncturing 1 bit from the parity part at every $(N_1-K_1)/(N_A-K_A)$ bits. However, various other methods can also be applied as the puncturing technique.

For $N_A-K_A=0$, there is no need to apply the puncturing technique. In this particular case, it is possible to get a high-efficiency shortened DVB-S2 LDPC code by applying a similar generation method for the DVB-S2 LDPC code using the shortening pattern shown in Table 1.

Figure 7:
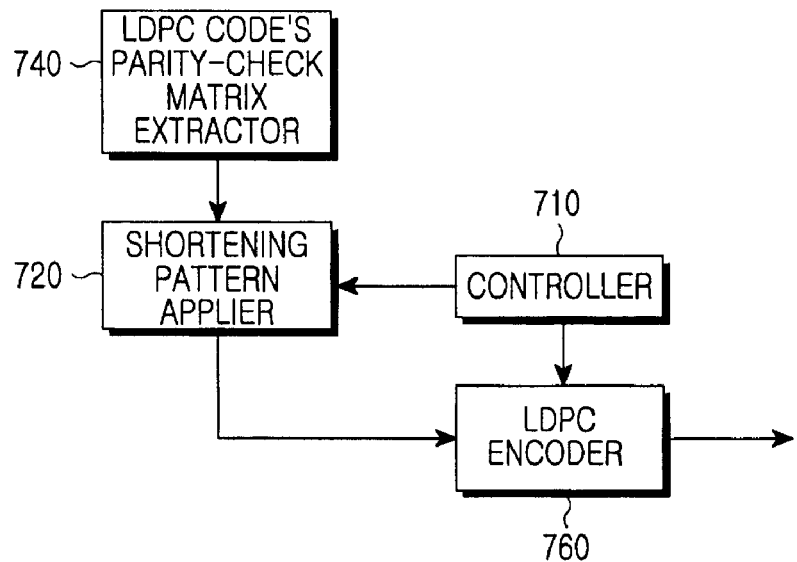
FIG. 7 is a block diagram illustrating a structure of a transmission apparatus using shortened LDPC codes according to an embodiment of the present invention.

Shown in FIG. 7 is a detailed example of a transmission apparatus for implementing a shortening process for the DVB-S2 LDPC code. FIG. 7 is a block diagram illustrating an exemplary structure of a transmission apparatus using shortened LDPC codes according to an embodiment of the present invention.

The transmission apparatus includes, for example, a controller 710, a shortening pattern applier 720, an LDPC code's parity-check matrix extractor 740, and an LDPC encoder 760.

The LDPC code's parity-check matrix extractor 740 extracts a shortened LDPC code parity-check matrix. The LDPC code parity-check matrix can be extracted from a memory, or can be given in the transmission apparatus, or can be generated by the transmission apparatus.

The controller 710 controls the shortening pattern applier 720 so that it can determine a shortening pattern according to an information length. The shortening pattern applier 720 inserts zero (0)-bits at the positions of shortened bits, or removes columns corresponding to the shortened bits from the parity-check matrix of a given LDPC code. A method of determining the shortening pattern can use a shortening pattern stored in a memory, generate a shortening pattern using a sequence generator (not shown), or use a density evolution analysis algorithm for a parity-check matrix and its given information length.

The controller 710 controls the shortening pattern applier 720 so that it can shorten a part of the information bits of the LDPC code in the patterns shown in Table 1 through Table 3.

The LDPC encoder 760 performs encoding based on the LDPC code shortened by the controller 710 and the shortening pattern applier 720.

Figure 8:
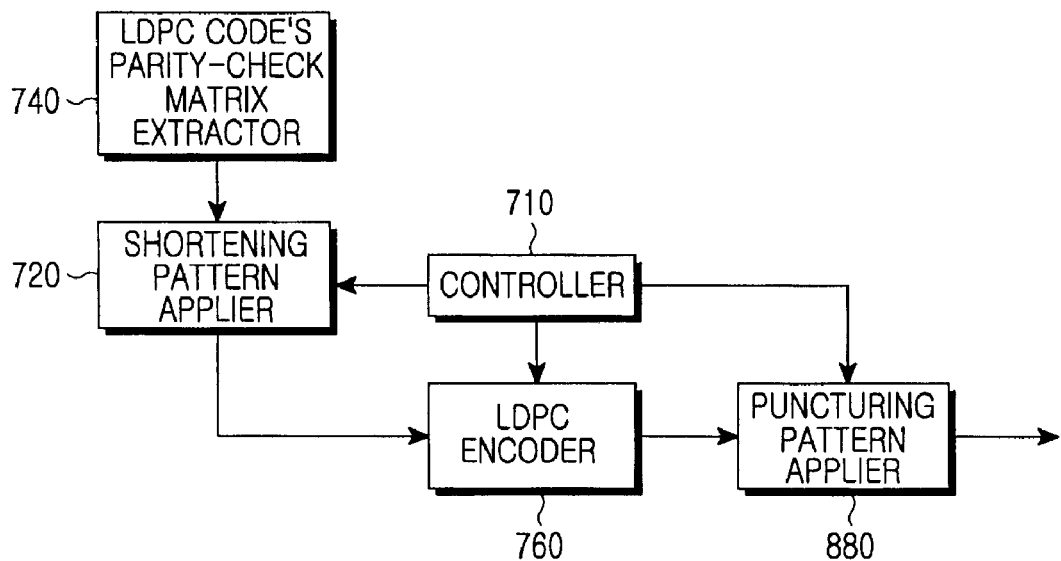
FIG. 8 is a block diagram illustrating a structure of a transmission apparatus using shortened/punctured LDPC codes according to an exemplary embodiment of the present invention.
Figure 9:
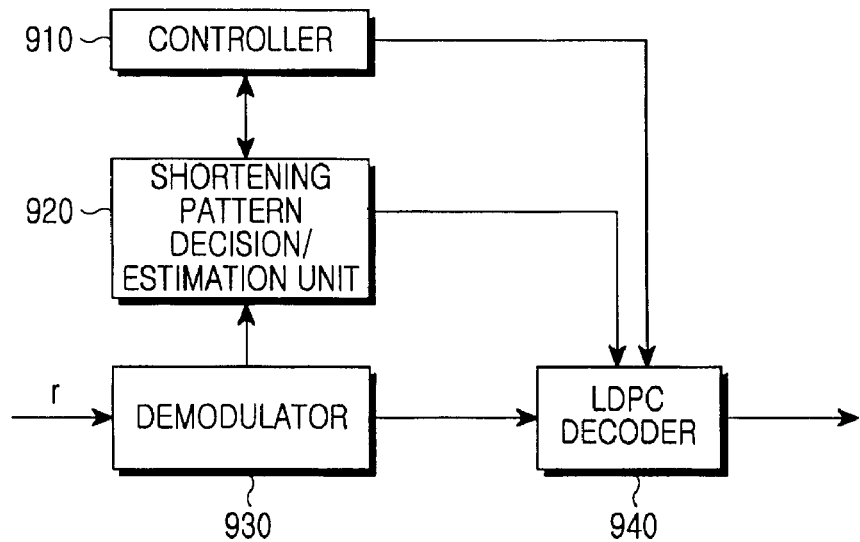
FIG. 9 is a block diagram illustrating a structure of a reception apparatus using LDPC codes to which shortening is applied, according to an exemplary embodiment of the present invention.

FIGS. 8 and 9 are block diagrams illustrating structures of a transmission apparatus and a reception apparatus for a DVB-S2 LDPC code to which shortening and puncturing are both applied, respectively.

FIG. 8 is a block diagram illustrating an exemplary structure of a transmission apparatus using shortened/punctured LDPC codes according to an embodiment of the present invention.

The transmission apparatus of FIG. 8 further comprises a puncturing pattern applier 880 added to the transmission apparatus of FIG. 7. Referring to FIG. 8, it can be appreciated that shortening is carried out in the front stage of the LDPC encoder 760 and puncturing is performed in the output stage of the LDPC encoder 760.

The puncturing pattern applier 880 applies puncturing to the output of the LDPC encoder 760. The method of applying puncturing has been described in detail in step 613 of FIG. 6.

FIG. 9 is a block diagram illustrating an exemplary structure of a reception apparatus using LDPC codes to which shortening is applied, according to an embodiment of the present invention.

Shown in FIG. 9 is an example of a reception apparatus that receives a signal transmitted from a communication system using the shortened DVB-S2 LDPC code, and restores the data desired by a user from the received signal when a length of the shortened DVB-S2 LDPC code is determined from the received signal.

The reception apparatus includes, for example, a controller 910, a shortening pattern decision/estimation unit 920, a demodulator 930, and a LDPC decoder 940.

The demodulator 930 receives and demodulates a shortened LDPC code, and provides the demodulated signal to the shortening pattern decision/estimation unit 920 and the LDPC decoder 940.

The shortening pattern decision/estimation unit 920, under the control of the controller 910, estimates or decides information on a shortening pattern of an LDPC code from the demodulated signal, and provides position information of the shortened bits to the LDPC decoder 940. A method of deciding or estimating a shortening pattern in the shortening pattern decision/estimation unit 920 can use a shortening pattern stored in a memory, or generate a shortening pattern using sequence generator (not shown), or use a density evolution analysis algorithm for a parity-check matrix and its given information length.

Since a probability that values of shortened bits will be zero (0) in the LDPC decoder 940 is 1 (or 100%), the controller 910 decides whether it will decode the shortened bits by means of the LDPC decoder 940, using the probability value of 1.

The LDPC decoder 940 restores data desired by the user from the received signal when it finds a length of the shortened DVB-S2 LDPC code by means of the shortening pattern decision/estimation unit 920.

Figure 10:
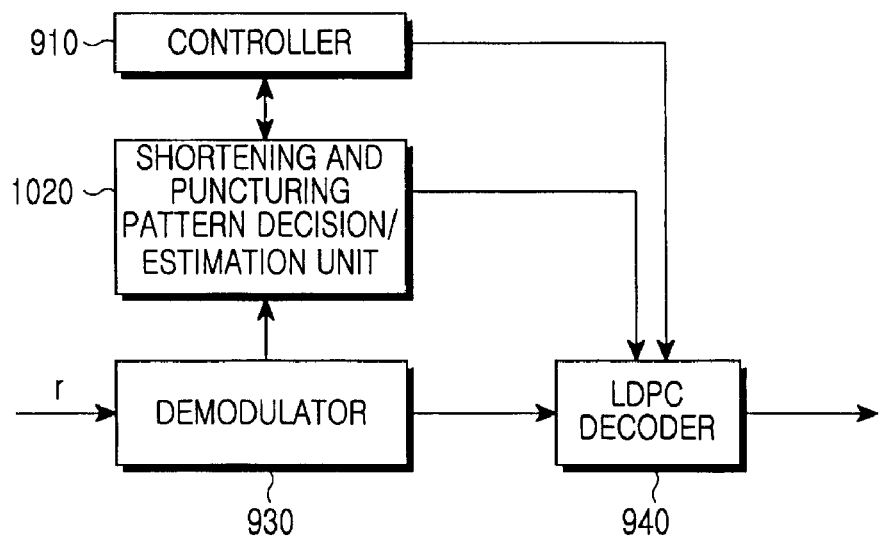
FIG. 10 is a block diagram illustrating a structure of a reception apparatus using LDPC codes to which shortening and puncturing are both applied, according to an exemplary embodiment of the present invention.

FIG. 10 is a block diagram illustrating an exemplary structure of a reception apparatus using LDPC codes to which shortening and puncturing are both applied, according to an embodiment of the present invention.

In the reception apparatus of FIG. 10, a shortening and puncturing pattern decision/estimation unit 1020 replaces the shortening pattern decision/estimation unit 920 of FIG. 9.

When the transmission apparatus applies both shortening and puncturing, the shortening and puncturing pattern decision/estimation unit 1020 in the reception apparatus can first perform pattern decision/estimation on shortening, or can first perform pattern decision/estimation on puncturing, or can simultaneously perform pattern decision/estimation on shortening and pattern decision/estimation on puncturing.

The LDPC decoder 940 preferably has information on both shortening and puncturing in order to perform decoding.

Figure 11:
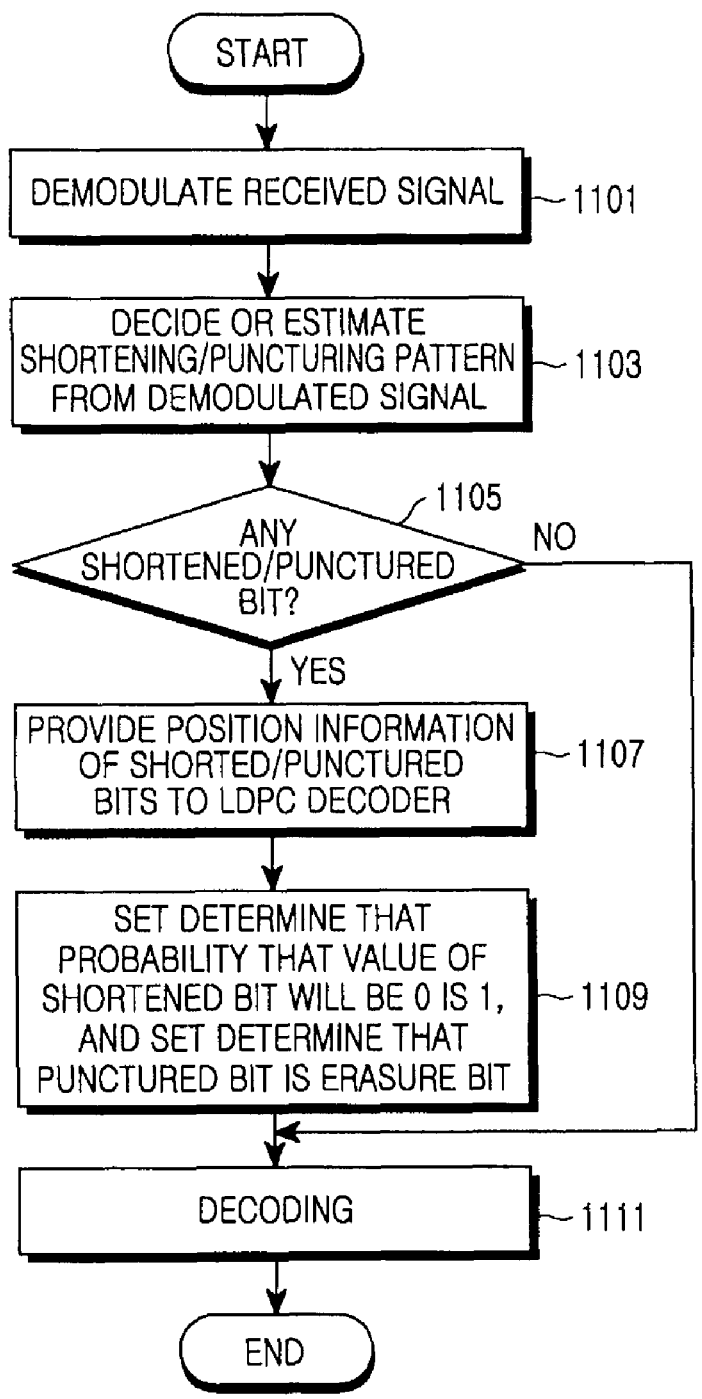
FIG. 11 is a flowchart illustrating a reception operation in a reception apparatus according to an exemplary embodiment of the present invention.

FIG. 11 is a flowchart illustrating an exemplary reception operation in a reception apparatus according to an embodiment of the present invention.

A demodulator 930 receives and demodulates a shortened LDPC code in step 1101. Thereafter, a shortening pattern decision/estimation unit 920 decides or estimates a shortening/puncturing pattern(s) from the demodulated signal in step 1103.

The shortening pattern decision/estimation unit 920 determines in step 1105 whether there is any shortened/punctured bit. If there is no shortened/punctured bit, a LDPC decoder 940 performs decoding in step 1111. However, if there is shortened/punctured bit(s), a shortening and puncturing pattern decision/estimation unit 1020 provides the position information of the shortened/punctured bits to the LDPC decoder 940 in step 1107.

In step 1109, based on the position information of the shortened/punctured bits, the LDPC decoder 940 determines that the probability that values of the shortened bits will be 0 is 1, and determines that the punctured bits are erased bits. Thereafter, the LDPC decoder 940 proceeds to step 1111 where it performs LDPC decoding.

As is apparent from the foregoing description, the present invention provides shortening patterns, thus making it possible not to substantially use some columns. In addition, the present invention can generate separate LDPC codes having different codeword lengths using information on a given parity-check matrix in a communication system using LDPC codes.

The above-described methods according to the present invention can be realized in hardware or as software or computer code that can be stored in a recording medium such as a CD ROM, an RAM, a floppy disk, a hard disk, or a magneto-optical disk or downloaded over a network, so that the methods described herein can be executed by such software using a general purpose computer, or a special processor or in programmable or dedicated hardware, such as an ASIC or FPGA. As would be understood in the art, the computer, the processor or the programmable hardware include memory components, e.g., RAM, ROM, Flash, etc. that may store or receive software or computer code that when accessed and executed by the computer, processor or hardware implement the processing methods described herein.

While the invention has been shown and described with reference to a certain preferred embodiment thereof, it will be understood by those skilled in the art that various changes in form and details may be made therein without departing from the spirit and range of the invention as defined by the appended claims.

What is claimed is:

1. A method for encoding a channel in a communication system using a Low-Density Parity-Check (LDPC) code, the method comprising:
    (a) generating a plurality of column groups by categorizing columns corresponding to an information word in a parity-check matrix of the LDPC code, and ordering the column groups;
    (b) determining a range of the information word desired to be obtained by performing shortening;
    (c) based on the determined range of the information word, performing column group-by-column group shortening on the column groups in order according to a predetermined shortening pattern; and
    (d) LDPC encoding the shortened information word.

2. The method of claim 1, wherein performing column group-by-column group shortening in (c) comprises:
    (e) shortening all column groups in order according to the predetermined shortening pattern, and when a part of a particular column group is shortened, shortening no columns in positions corresponding to 168 Bose-Chaudhuri-Hocquenghem (BCH) parity bits.

3. The method of claim 1, wherein performing column group-by-column group shortening in (c) comprises:
    applying a shortening pattern defined in a following table when applying shortening to an LDPC code for which a length of an LDPC code is 16200 and a length of an information word is 3240;

| | |
|---|---|
| Major variables of DVB-S2 LDPC code | $N_1 = 16200$, $K_1 = 3240$, $M_1 = 360$, $q = 36$ |
| Scope of $K_2$ | Shortening Method |
| 1) $528 \leq K_2 < 3240$ | For an integer $m = \left\lfloor \dfrac{3240 - K_2}{360} \right\rfloor$, shortens all of m column groups corresponding to $\pi(0)^{th}$, $\pi(1)^{th}$, ..., and $\pi(m-1)^{th}$ column groups, and additionally shortens $3240-K_2-360$ m information bits from a $\pi(m)^{th}$ column group. Herein, $\pi$ denotes a permutation function meaning a shortening pattern, and a relationship therebetween is shown at the bottom of the table. However, when a part of a $\pi(7) = 8^{th}$ column group is shortened, the columns in the positions corresponding to the 168 BCH parity bits are not subjected to shortening. |
| 2) $168 \leq K_2 < 528$ | Shortens all of $\pi(0)^{th}$, $\pi(1)^{th}$, ..., and $\pi(6)^{th}$ column groups, and shortens all columns except for the columns in the positions corresponding to 168 BCH parity bits from the $\pi(7) = 8^{th}$ column group. Further, additionally shortens $528-K_2$ information bits from a $\pi(8) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 7 | 3 | 6 | 5 | 2 | 4 | 1 | 8 | 0 | where $N_1$ denotes a length of an LDPC code, $K_1$ denotes a length of an information word, $M_1$ denotes the number of columns constituting one column group, and q is an integer satisfying the following equation:

$q = (N_1 - K_1)/M_1$ where $K_1/M_1$ comprises an integer.

4. The method of claim 1, wherein performing column group-by-column group shortening comprises:
applying a shortening pattern defined in a following table when applying shortening to an LDPC code for which a length of an LDPC code is 16200 and a length of an information word is 7200;

| | |
|---|---|
| Major variables of DVB-S2 LDPC code | $N_1 = 16200$, $K_1 = 7200$, $M_1 = 360$, $q = 25$ |
| Scope of $K_2$ | Shortening Method |
| 1) $528 \leq K_2 < 7200$ | For an integer $m = \left\lfloor \dfrac{7200 - K_2}{360} \right\rfloor$, shortens all of m column groups corresponding to $\pi(0)^{th}$, $\pi(1)^{th}$, ..., and $\pi(m-1)^{th}$ column groups, and additionally shortens $7200-K_2-360$ m information bits from a $\pi(m)^{th}$ column group. Herein, $\pi$ denotes a permutation function meaning a shortening pattern, and a relationship therebetween is shown at the bottom of the table. However, when a part of a $\pi(18) = 19^{th}$ column group is shortened, the columns in the positions corresponding to the 168 BCH parity bits are not subjected to shortening. |
| 2) $168 \leq K_2 < 528$ | Shortens all of $\pi(0)^{th}$, $\pi(1)^{th}$, ..., and $\pi(17)^{th}$ column groups, and shortens all columns except for the columns in the positions corresponding to 168 BCH parity bits from the $\pi(18) = 19^{th}$ column group. Further, additionally shortens $528-K_2$ information bits from a $\pi(19) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 3 | 2 | 7 | 6 | 5 | 1 | 19 | 0 | where $N_1$ denotes a length of an LDPC code, $K_1$ denotes a length of an information word, $M_1$ denotes a number of columns constituting one column group, and q is an integer satisfying the following equation:

$q = (N_1 - K_1)/M_1$ where $K_1/M_1$ comprises an integer.

5. A method for encoding a channel in a communication system using a Low-Density Parity-Check (LDPC) code, the method comprising:
(a) generating a plurality of column groups by categorizing columns corresponding to an information word in a parity-check matrix of the LDPC code, and ordering the column groups;
(b) determining a range of the information word desired to be obtained by performing shortening;
(c) based on the determined range of the information word, performing column group-by-column group shortening on the column groups in order according to a predetermined shortening pattern; and
(d) LDPC encoding the shortened information word;
wherein performing column group-by-column group shortening comprises including 168 Bose-Chaudhuri-Hocquenghem (BCH) parity bits in an information word desired to be obtained by performing shortening, and shortening columns except for columns in positions corresponding to the 168 BCH parity bits.

6. The method of claim 5, wherein performing column group-by-column group shortening in (c) comprises:
applying a shortening pattern defined in a following table when applying shortening to an LDPC code for which a length of an LDPC code comprises 16200 and a length of an information word comprises 3240;

| | |
|---|---|
| Major variables of DVB-S2 LDPC code | $N_1 = 16200$, $K_1 = 3240$, $M_1 = 360$, $q = 36$ |
| Scope of $K_2$ | Shortening Method |
| 1) $528 \leq K_2 < 3240$ | For an integer $m = \left\lfloor \dfrac{3240 - K_2}{360} \right\rfloor$, shortens all of m groups corresponding to $\pi(0)^{th}$, $\pi(1)^{th}$, ..., and $\pi(m-1)^{th}$ column groups, and additionally shortens $3240-K_2-360$ m information bits from a $\pi(m)^{th}$ column group. Herein, $\pi$ denotes a permutation function meaning a shortening pattern, and a relationship therebetween is shown at the bottom of the table. However, when a part of a $\pi(7) = 8^{th}$ column group is shortened, the columns |

-continued

| | |
|---|---|
| 2) $168 \leq K_2 < 528$ | in the positions corresponding to the 168 BCH parity bits are not subected to shortening.<br>Shortens all of $\pi(0)^{th}, \pi(1)^{th}, \ldots$, and $\pi(6)^{th}$ column groups, and shortens all columns except for the columns in the positions corresponding to 168 BCH parity bits from the $\pi(7) = 8^{th}$ column group. Further, additionally shortens 528-$K_2$ information bits from a $\pi(8) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 7 | 3 | 6 | 5 | 2 | 4 | 1 | 8 | 0 | where $N_1$ denotes a length of an LDPC code, $K_1$ denotes a length of an information word, $M_1$ denotes a number of columns constituting one column group, and q is an integer satisfying a following equation:

$$q=(N_1-K_1)/M_1$$

where $K_1/M_1$ comprises an integer.

7. The method of claim 5, wherein performing column group-by-column group shortening in (c) comprises:
applying a shortening pattern defined in a following table when applying shortening to an LDPC code for which a length of an LDPC code comprises 16200 and a length of an information word comprises 7200;

| Major variables of DVB-S2 LDPC code | $N_1 = 16200, K_1 = 7200, M_1 = 360, q = 25$ |
|---|---|
| Scope of $K_2$ | Shortening Method |
| 1) $528 \leq K_2 < 7200$ | For an integer $m = \left\lfloor \dfrac{7200 - K_2}{360} \right\rfloor$, shortens all of m column groups corresponding to $\pi(0)^{th}, \pi(1)^{th}, \ldots$, and $\pi(m-1)^{th}$ column groups, and additionally shortens 7200-$K_2$-360 m information bits from a $\pi(m)^{th}$ column group. Herein, $\pi$ denotes a permutation function meaning a shortening pattern, and a relationship therebetween is shown at the bottom of the table.<br>However, when a part of a $\pi(18) = 19^{th}$ column group is shortened, the columns in the positions corresponding to the 168 BCH parity bits are not subjected to shortening. |
| 2) $168 \leq K_2 < 528$ | Shortens all of $\pi(0)^{th}, \pi(1)^{th}, \ldots$, and $\pi(17)^{th}$ column groups, and shortens all columns except for the columns in the positions corresponding to 168 BCH parity bits from the $\pi(18) = 19^{th}$ column group. Further, additionally shortens 528-$K_2$ information bits from a $\pi(19) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |

| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
|---|---|---|---|---|---|---|---|---|---|
| 9 | 8 | 3 | 2 | 7 | 6 | 5 | 1 | 19 | 0 | where $N_1$ denotes a length of an LDPC code, $K_1$ denotes a length of an information word, $M_1$ denotes a number of columns constituting one column group, and q is an integer satisfying a following equation:

$$q=(N_1-K_1)/M_1$$

where $K_1/M_1$ comprises an integer.

8. An apparatus for encoding a channel in a communication system using a Low-Density Parity-Check (LDPC) code, the apparatus comprising:
a parity-check matrix extractor for generating a plurality of column groups by grouping columns corresponding to an information word in a parity-check matrix of the LDPC code, and ordering the column groups;
a shortening pattern applier for determining a range of an information word desired to be obtained by performing shortening, and based on a determined range of the information word, for performing column group-by-column group shortening on the column groups in order according to a predetermined shortening pattern; and
an encoder for LDPC encoding the shortened information word.

9. The apparatus of claim 8, wherein in performing column group-by-column group shortening, the shortening pattern applier shortens all column groups in order according to the predetermined shortening pattern, and when a part of a column group is shortened, shortens no columns in positions corresponding to 168 Bose-Chaudhuri-Hocquenghem (BCH) parity bits.

10. The apparatus of claim 8, wherein in performing column group-by-column group shortening, the shortening pattern applier applies a shortening pattern defined in the following table when applying shortening to an LDPC code for which a length of an LDPC code is 16200 and a length of an information word comprises 3240;

| | |
|---|---|
| Major variables of DVB-S2 LDPC code | $N_1 = 16200, K_1 = 3240, M_1 = 360, q = 36$ |
| Range of $K_2$ | Shortening Method |
| 1) $528 \leq K_2 < 3240$ | For an integer $m = \left\lfloor \dfrac{3240 - K_2}{360} \right\rfloor$, shortens all of m groups corresponding to $\pi(0)^{th}, \pi(1)^{th}, \ldots,$ and $\pi(m-1)^{th}$ column groups, and additionally shortens $3240-K_2-360$ m information bits from a $\pi(m)^{th}$ column group. Herein, $\pi$ denotes a permutation function meaning a shortening pattern, and a relationship |

-continued

| $K_2$ information bits from a $\pi(8) = 0^{th}$ column group. | | | | | | | | |
|---|---|---|---|---|---|---|---|---|
| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
| 7 | 3 | 6 | 5 | 2 | 4 | 1 | 8 | 0 | where $N_1$ denotes a length of an LDPC code, $K_1$ denotes a length of an information word, $M_1$ denotes a number of columns constituting one column group, and q is an integer satisfying the following equation:

$q=(N_1-K_1)/M_1$ where $K_1/M_1$ is an integer.

11. The apparatus of claim 8, wherein in performing column group-by-column group shortening, the shortening pattern applier applies a shortening pattern defined in a following table when applying shortening to an LDPC code for which a length of an LDPC code comprises 16200 and a length of an information word comprises 7200;

| | |
|---|---|
| Major variables of DVB-S2 LDPC code | $N_1 = 16200, K_1 = 7200, M_1 = 360, q = 25$ |
| Scope of $K_2$ | Shortening Method |
| 1) $528 \leq K_2 < 7200$ | For an integer $m = \left\lfloor \dfrac{7200 - K_2}{360} \right\rfloor$, shortens all of m column groups corresponding to $\pi(0)^{th}, \pi(1)^{th}, \ldots,$ and $\pi(m-1)^{th}$ column groups, and additionally shortens $7200-K_2-360$ m information bits from a $\pi(m)^{th}$ column group. Herein, $\pi$ denotes a permutation function meaning a shortening pattern, and a relationship therebetween is shown at the bottom of the table. However, when a part of a $\pi(18) = 19^{th}$ column group is shortened, the columns in the positions corresponding to the 168 BCH parity bits are not subjected to shortening. |
| 2) $168 \leq K_2 < 528$ | Shortens all of $\pi(0)^{th}, \pi(1)^{th}, \ldots,$ and $\pi(17)^{th}$ column groups, and shortens all columns except for the columns in the positions corresponding to 168 BCH parity bits from the $\pi(18) = 19^{th}$ column group. Further, additionally shortens $528-K_2$ information bits from a $\pi(19) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 3 | 2 | 7 | 6 | 5 | 1 | 19 | 0 |

-continued

| | |
|---|---|
| | therebetween is shown at the bottom of the table. However, when a part of a $\pi(7) = 8^{th}$ column group is shortened, the columns in the positions corresponding to the 168 BCH parity bits are not subected to shortening. |
| 2) $168 \leq K_2 < 528$ | Shortens all of $\pi(0)^{th}, \pi(1)^{th}, \ldots,$ and $\pi(6)^{th}$ column groups, and shortens all columns except for the columns in the positions corresponding to 168 BCH parity bits from the $\pi(7) = 8^{th}$ column group. Further, additionally shortens $528-$ | where $N_1$ denotes a length of an LDPC code, $K_1$ denotes a length of an information word, $M_1$ denotes a number of columns constituting one column group, and q is an integer satisfying the following equation:

$q=(N_1-K_1)/M_1$ where $K_1/M_1$ comprises an integer.

12. An apparatus for encoding a channel in a communication system using a Low-Density Parity-Check (LDPC) code, the apparatus comprising:

a parity-check matrix extractor for generating a plurality of column groups by grouping columns corresponding to an information word in a parity-check matrix of the LDPC code, and ordering the column groups;

a shortening pattern applier for determining a range of an information word desired to be obtained by performing shortening, and based on the determined range of the information word, for performing column group-by-column group shortening on the column groups in order according to a predetermined shortening pattern; and an encoder for LDPC encoding the shortened information word;

wherein in performing column group-by-column group shortening, the shortening pattern applier includes 168 Bose-Chaudhuri-Hocquenghem (BCH) parity bits in an information word desired to be obtained by performing shortening, and shortens columns except for columns in positions corresponding to the 168 BCH parity bits.

13. The apparatus of claim 12, wherein in performing column group-by-column group shortening, the shortening pattern applier applies a shortening pattern defined in a following table when applying shortening to an LDPC code for which a length of an LDPC code is 16200 and a length of an information word is 3240;

| Major variables of DVB-S2 LDPC code | $N_1 = 16200, K_1 = 3240, M_1 = 360, q = 36$ |
|---|---|
| Scope of $K_2$ | Shortening Method |
| 1) $528 \leq K_2 < 3240$ | For an integer $m = \left\lfloor \dfrac{3240 - K_2}{360} \right\rfloor$, shortens all of m groups corresponding to $\pi(0)^{th}, \pi(1)^{th}, \ldots,$ and $\pi(m-1)^{th}$ column groups, and additionally shortens 3240-$K_2$-360 m information bits from a $\pi(m)^{th}$ column group. Herein, $\pi$ denotes a permutation function meaning a shortening pattern, and a relationship therebetween is shown at the bottom of the table. However, when a part of a $\pi(7) = 8^{th}$ column group is shortened, the columns in the positions corresponding to the 168 BCH parity bits are not subected to shortening. |
| 2) $168 \leq K_2 < 528$ | Shortens all of $\pi(0)^{th}, \pi(1)^{th}, \ldots,$ and $\pi(6)^{th}$ column groups, and shortens all columns except for the columns in the positions corresponding to 168 BCH parity bits from the $\pi(7) = 8^{th}$ column group. Further, additionally shortens 528-$K_2$ information bits from a $\pi(8) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 7 | 3 | 6 | 5 | 2 | 4 | 1 | 8 | 0 | where $N_1$ denotes a length of an LDPC code, $K_1$ denotes a length of an information word, $M_1$ denotes a number of columns constituting one column group, and q is an integer satisfying the following equation:

$q = (N_1 - K_1)/M_1$ where $K_1/M_1$ is an integer.

14. The apparatus of claim 12, wherein in performing column group-by-column group shortening, the shortening pattern applier applies a shortening pattern defined in a following table when applying shortening to an LDPC code for which a length of an LDPC code comprises 16200 and a length of an information word comprises 7200;

| Major variables of DVB-S2 LDPC code | $N_1 = 16200, K_1 = 7200, M_1 = 360, q = 25$ |
|---|---|
| Scope of $K_2$ | Shortening Method |
| 1) $528 \leq K_2 < 7200$ | For an integer $m = \left\lfloor \dfrac{7200 - K_2}{360} \right\rfloor$, shortens all of m column groups corresponding to $\pi(0)^{th}, \pi(1)^{th}, \ldots,$ and $\pi(m-1)^{th}$ column groups, and additionally shortens 7200-$K_2$-360 m information bits from a $\pi(m)^{th}$ column group. Herein, $\pi$ denotes a permutation function meaning a shortening pattern, and a relationship therebetween is shown at the bottom of the table. However, when a part of a $\pi(18) = 19^{th}$ column group is shortened, the columns in the positions corresponding to the 168 BCH parity bits are not subjected to shortening. |
| 2) $168 \leq K_2 < 528$ | Shortens all of $\pi(0)^{th}, \pi(1)^{th}, \ldots,$ and $\pi(17)^{th}$ column groups, and shortens all columns except for the columns in the positions corresponding to 168 BCH parity bits from the $\pi(18) = 19^{th}$ column group. Further, additionally shortens 528-$K_2$ information bits from a $\pi(19) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 3 | 2 | 7 | 6 | 5 | 1 | 19 | 0 | where $N_1$ denotes a length of an LDPC code, $K_1$ denotes a length of an information word, $M_1$ denotes a number of columns constituting one column group, and q is an integer satisfying the following equation:

$$q=(N_1-K_1)/M_1$$

where $K_1/M_1$ comprises an integer.

15. A method for decoding a channel in a communication system using a Low-Density Parity-Check (LDPC) code, the method comprising:
   (a) demodulating a signal transmitted from a transmitter;
   (b) determining a position of a shortened bit by estimating information on a shortening pattern of an LDPC code from the demodulated signal from (a); and
   (c) decoding data using the determined position of the shortened bit.

16. The method of claim 15, wherein the information on a shortening pattern comprises a shortening pattern defined in a following table;

| Major variables of DVB-S2 LDPC code | $N_1 = 16200, K_1 = 3240, M_1 = 360, q = 36$ |
|---|---|
| Scope of $K_2$ | Shortening Method |
| 1) $528 \leq K_2 < 3240$ | For an integer $m = \left\lfloor \dfrac{3240 - K_2}{360} \right\rfloor$, shortens all of m groups corresponding to $\pi(0)^{th}, \pi(1)^{th}, \ldots,$ and $\pi(m-1)^{th}$ column groups, and additionally shortens $3240-K_2-360$ m information bits from a $\pi(m)^{th}$ column group. Herein, $\pi$ denotes a permutation function meaning a shortening pattern, and a relationship therebetween is shown at the bottom of the table. However, when a part of a $\pi(7) = 8^{th}$ column group is shortened, the columns in the positions corresponding to the 168 BCH parity bits are not subected to shortening. |
| 2) $168 \leq K_2 < 528$ | Shortens all of $\pi(0)^{th}, \pi(1)^{th}, \ldots,$ and $\pi(6)^{th}$ column groups, and shortens all columns except for the columns in the positions corresponding to 168 BCH parity bits from the $\pi(7) = 8^{th}$ column group. Further, additionally shortens $528-K_2$ information bits from a $\pi(8) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 7 | 3 | 6 | 5 | 2 | 4 | 1 | 8 | 0 | where $N_1$ denotes a length of an LDPC code, $K_1$ denotes a length of an information word, $M_1$ denotes a number of columns constituting one column group, and q is an integer satisfying the following equation:

$$q=(N_1-K_1)/M_1$$

where $K_1/M_1$ comprises an integer.

17. The method of claim 15, wherein the information on a shortening pattern comprises a shortening pattern defined in a following table;

| Major variables of DVB-S2 LDPC code | $N_1 = 16200, K_1 = 7200, M_1 = 360, q = 25$ |
|---|---|
| Scope of $K_2$ | Shortening Method |
| 1) $528 \leq K_2 < 7200$ | For an integer $m = \left\lfloor \dfrac{7200 - K_2}{360} \right\rfloor$, shortens all of m column groups corresponding to $\pi(0)^{th}, \pi(1)^{th}, \ldots,$ and $\pi(m-1)^{th}$ column groups, and additionally shortens $7200-K_2-360$ m information bits from a $\pi(m)^{th}$ column group. Herein, $\pi$ denotes a permutation function meaning a shortening pattern, and a relationship therebetween is shown at the bottom of the table. However, when a part of a $\pi(18) = 19^{th}$ column group is shortened, the columns in the positions corresponding to the 168 BCH parity bits are not subjected to shortening. |
| 2) $168 \leq K_2 < 528$ | Shortens all of $\pi(0)^{th}, \pi(1)^{th}, \ldots,$ and $\pi(17)^{th}$ column groups, and shortens all columns except for the columns in the positions corresponding to 168 BCH parity bits from the $\pi(18) = 19^{th}$ column group. Further, additionally shortens $528-K_2$ information bits from a $\pi(19) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |
| $\pi(10)$ | $\pi(11)$ | $\pi(12)$ | $\pi(13)$ | $\pi(14)$ | $\pi(15)$ | $\pi(16)$ | $\pi(17)$ | $\pi(18)$ | $\pi(19)$ |
| 9 | 8 | 3 | 2 | 7 | 6 | 5 | 1 | 19 | 0 | where $N_1$ denotes a length of an LDPC code, $K_1$ denotes a length of an information word, $M_1$ denotes a number of columns constituting one column group, and q is an integer satisfying the following equation:

$$q=(N_1-K_1)/M_1$$

where $K_1/M_1$ comprises an integer.

18. An apparatus for decoding a channel in a communication system using a Low-Density Parity-Check (LDPC) code, the apparatus comprising:
a demodulator for demodulating a signal transmitted from a transmitter;
a shortening pattern determiner for determining a position of a shortened bit by estimating information on a shortening pattern of an LDPC code from the demodulated signal; and
a decoder for decoding data using the determined position of the shortened bit.

19. The apparatus of claim 18, wherein the information on a shortening pattern comprises a shortening pattern defined in a following table;

| Major variables of DVB-S2 LDPC code | $N_1 = 16200, K_1 = 3240, M_1 = 360, q = 36$ |
|---|---|
| Scope of $K_2$ | Shortening Method |
| 1) $528 \leq K_2 < 3240$ | For an integer $m = \left\lfloor \dfrac{3240 - K_2}{360} \right\rfloor$, shortens all of m groups corresponding to $\pi(0)^{th}, \pi(1)^{th}, \ldots,$ and $\pi(m-1)^{th}$ column groups, and additionally shortens $3240-K_2-360$ m information bits from a $\pi(m)^{th}$ column group. Herein, $\pi$ denotes a permutation function meaning a shortening pattern, and a relationship therebetween is shown at the bottom of the table. However, when a part of a $\pi(7) = 8^{th}$ column group is shortened, the columns in the positions corresponding to the 168 BCH parity bits are not subected to shortening. |
| 2) $168 \leq K_2 < 528$ | Shortens all of $\pi(0)^{th}, \pi(1)^{th}, \ldots,$ and $\pi(6)^{th}$ column groups, and shortens all columns except for the columns in the positions corresponding to 168 BCH parity bits from the $\pi(7) = 8^{th}$ column group. Further, additionally shortens $528-K_2$ information bits from a $\pi(8) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 7 | 3 | 6 | 5 | 2 | 4 | 1 | 8 | 0 | where $N_1$ denotes a length of an LDPC code, $K_1$ denotes a length of an information word, $M_1$ denotes a number of columns constituting one column group, and q is an integer satisfying the following equation:

$$q=(N_1-K_1)/M_1$$

where $K_1/M_1$ comprises an integer.

20. The apparatus of claim 18, wherein the information on a shortening pattern comprises a shortening pattern defined in a following table;

| Major variables of DVB-S2 LDPC code | $N_1 = 16200, K_1 = 7200, M_1 = 360, q = 25$ |
|---|---|
| Scope of $K_2$ | Shortening Method |
| 1) $528 \leq K_2 < 7200$ | For an integer $m = \left\lfloor \dfrac{7200 - K_2}{360} \right\rfloor$, shortens all of m column groups corresponding to $\pi(0)^{th}, \pi(1)^{th}, \ldots,$ and $\pi(m-1)^{th}$ column groups, and additionally shortens $7200-K_2-360$ m information bits from a $\pi(m)^{th}$ column group. Herein, $\pi$ denotes a permutation function meaning a shortening pattern, and a relationship therebetween is shown at the bottom of the table. However, when a part of a $\pi(18) = 19^{th}$ column group is shortened, the columns in the positions corresponding to the168 BCH parity bits are not subjected to shortening. |
| 2) $168 \leq K_2 < 528$ | Shortens all of $\pi(0)^{th}, \pi(1)^{th}, \ldots,$ and $\pi(17)^{th}$ column groups, and shortens all columns except for the columns in the positions corresponding to 168 BCH parity bits from the $\pi(18) = 19^{th}$ column group. Further, additionally shortens $528-K_2$ information bits from a $\pi(19) = 0^{th}$ column group. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ | $\pi(9)$ |
|---|---|---|---|---|---|---|---|---|---|
| 18 | 17 | 16 | 15 | 14 | 13 | 12 | 11 | 4 | 10 |
| $\pi$ | $\pi$ | $\pi$ | $\pi$ | $\pi$ | $\pi$ | $\pi$ | $\pi$ | $\pi$ | $\pi$ |

-continued

| (10) | (11) | (12) | (13) | (14) | (15) | (16) | (17) | (18) | (19) |
|---|---|---|---|---|---|---|---|---|---|
| 9 | 8 | 3 | 2 | 7 | 6 | 5 | 1 | 19 | 0 | where $N_1$ denotes a length of an LDPC code, $K_1$ denotes a length of an information word, $M_1$ denotes a number of columns constituting one column group, and q is an integer satisfying the following equation:

$$q=(N_1-K_1)/M_1$$

where $K_1/M_1$ comprises an integer.

* * * * *